US011936296B2

(12) United States Patent
Peretz

(10) Patent No.: US 11,936,296 B2
(45) Date of Patent: Mar. 19, 2024

(54) DIGITAL CONTROLLER FOR HIGH-PERFORMANCE MULTIPHASE VRM WITH CURRENT BALANCING AND NEAR-IDEAL TRANSIENT RESPONSE

(71) Applicant: B.G. NEGEV TECHNOLOGIES AND APPLICATIONS LTD., AT BEN-GURION UNIVERSITY, Beer Sheva (IL)

(72) Inventor: Mor Mordechai Peretz, Lehavim (IL)

(73) Assignee: B.G. NEGEV TECHNOLOGIES AND APPLICATIONS LTD., AT BEN-GURION UNIVERSITY, Beer Sheva (IL)

( * ) Notice: Subject to any disclaimer, the term of this patent is extended or adjusted under 35 U.S.C. 154(b) by 0 days.

(21) Appl. No.: 17/632,389

(22) PCT Filed: Aug. 4, 2020

(86) PCT No.: PCT/IL2020/050853
§ 371 (c)(1),
(2) Date: Feb. 2, 2022

(87) PCT Pub. No.: WO2021/024254
PCT Pub. Date: Feb. 11, 2021

(65) Prior Publication Data
US 2022/0294343 A1   Sep. 15, 2022

Related U.S. Application Data

(60) Provisional application No. 62/882,531, filed on Aug. 4, 2019.

(51) Int. Cl.
*H02M 3/158* (2006.01)
*H02M 1/00* (2006.01)
(Continued)

(52) U.S. Cl.
CPC ......... *H02M 3/157* (2013.01); *H02M 1/0003* (2021.05); *H02M 3/1566* (2021.05);
(Continued)

(58) Field of Classification Search
CPC .. H02M 3/1584; H02M 3/1586; H02M 3/157; H02M 1/0012; H02M 3/158
See application file for complete search history.

(56) References Cited

U.S. PATENT DOCUMENTS 7,622,820 B1 * 11/2009 Prodic ................... H02M 3/158
361/689
2008/0238390 A1   10/2008 Trivedi et al.
(Continued)

FOREIGN PATENT DOCUMENTS

WO   WO 2018/060990   4/2018

OTHER PUBLICATIONS

Extended European Search Report for corresponding European Application No. 20849359.3, dated Aug. 17, 2022, 11 pages.
(Continued)

*Primary Examiner* — Alex Torres-Rivera
(74) *Attorney, Agent, or Firm* — Dority & Manning, P.A.

(57) ABSTRACT

A mixed-signal controller for controlling a multiphase average-current-mode voltage regulator having an output connected to a load, which comprises a digital voltage-sampling ADC for converting the output voltage signal from analog to digital representation; a digital current-sampling ADC, for converting the inductor current from analog to digital representation; a digital compensator for generating a current reference signal, based on a digital voltage error signal and for generating a duty-ratio command signal, based on a digital current error signal; a multiphase Digital Pulse Width Modulator (DPWM), for generating a pulse-width-modulated signal (per-phase), to thereby control the per-phase
(Continued)

currents and output voltage supplied to the load; an analog front-end, in which single-ended signals are used for steady-state control via ADC measurement and the single-ended output voltage is used for transient detection and output voltage extremum detection during transient; a Transient Suppression Unit (TSU), for generating gating signals being fed to the gates of the converter's transistors during a transient event; a Phase Count Optimizer (PCO) unit generating an enable/disable control signal to each phase PWM output tri-state buffer; an Active Voltage Positioning (AVP) unit for generating the voltage loop compensator voltage reference signal.

16 Claims, 22 Drawing Sheets

(51) Int. Cl.
    *H02M 3/156*     (2006.01)
    *H02M 3/157*     (2006.01)
    *H03M 1/50*     (2006.01)

(52) U.S. Cl.
    CPC ....... *H02M 3/1584* (2013.01); *H02M 3/1586* (2021.05); *H03M 1/502* (2013.01)

(56) References Cited

U.S. PATENT DOCUMENTS

| | | | | |
|---|---|---|---|---|
| 2008/0310200 | A1* | 12/2008 | Maksimovic | H02M 3/1584 363/65 |
| 2009/0179681 | A1 | 7/2009 | Nakamura et al. | |
| 2009/0273498 | A1 | 11/2009 | Goder et al. | |
| 2011/0267019 | A1* | 11/2011 | Krishnamurthy | H02M 3/157 323/283 |
| 2011/0316508 | A1* | 12/2011 | Cheng | H02M 1/14 327/134 |
| 2012/0223692 | A1* | 9/2012 | Prodic | H02M 3/157 323/283 |
| 2014/0015500 | A1 | 1/2014 | Babazadeh et al. | |
| 2017/0141571 | A1 | 5/2017 | Wong et al. | |
| 2017/0148996 | A1* | 5/2017 | Ren | C07D 498/04 |

OTHER PUBLICATIONS

Li et al., "Master-Slave Control of Parallel-Operated Interfacing Inverters Based on Wireless Digital Communication", 2018 IEEE Energy Conversion Congress and Exposition (ECCE), Sep. 23-27, 2018, Portland, OR, pp. 1466-1472.

Pan et al., "A New Digital Adaptive Voltage Positioning Technique with Dynamically Varying Voltage and Current References", IEEE Transactions on Power Electronics vol. 24, No. 11, Nov. 2009, pp. 2612-2624.

Tahir et al., "Comparative Analysis of FPGA-based Digital Pulse Width Modulation Techniques for Multiphase DC-DC Converters", 2016 IEEE 2nd Annual Southern Power Electronics Conference (SPEC), Dec. 5-8, 2016, Auckland, New Zealand, 6 pages.

Vekslender et al., "Fully-Integrated Digital Average Current-Mode Control 12V-to-1.xV Voltage Regulator Module IC", 2017 IEEE Applied Power Electronics Conference and Exposition (APEC), Mar. 26-30, 2017, Tampa, FL, pp. 2043-2050.

PCT International Search Report and Written Opinion for corresponding Application No. PCT/IL2020/050853, dated Nov. 5, 2020, 9 pages.

Alico et al., "Multiphase Optimal Response Mixed-Signal Current Programmed Mode Controller," 2010 Twenty-Fifth Annual IEEE Applied Power Electronics Conference and Exposition (APEC), Feb. 21-25, 2010, Palm Springs, CA, pp. 1113-1118.

Halivni, "Enhanced Processing And Conversion Capabilities In Multi-Modular Energy Management Systems," Ben-Gurion University Of The Negev, PhD Dissertation, Oct. 1, 2019, 81 pages.

Kundu, "Digital Intensive Mixed Signal Circuits With In-situ Performance Monitors," University of Minnesota, PhD Dissertation, Nov. 30, 2016, 157 pages.

\* cited by examiner

DIGITAL CONTROLLER FOR HIGH-PERFORMANCE MULTIPHASE VRM WITH CURRENT BALANCING AND NEAR-IDEAL TRANSIENT RESPONSE

CROSS-REFERENCE TO RELATED APPLICATIONS

This application is a National Phase Application of International Application No. PCT/IL2020/050853, filed Aug. 4, 2020, which, in turn, claims the priority of U.S. Provisional Patent Application No. 62/882,531, filed on Aug. 4, 2019, both of which are hereby incorporated herein by reference in their entirety.

FIELD OF THE INVENTION

The present invention relates to the field of Voltage Regulator Modules (VRMs). More particularly, the invention relates to a digital controller for high-performance multiphase VRM with current balancing and near-ideal transient response.

BACKGROUND OF THE INVENTION

With the proliferation of cloud computing, power consumption of datacenters has grown significantly [1]. Datacenters typically use a large number of CPUs and Double Data-Rate (DDR) memory modules, each requires a highly-regulated DC voltage, under extremely strict requirements and specifications. Formed by the Open Compute Project (OCP) standardization in recent years [2], the power processing chain of datacenters applications has a 48 Vdc unregulated bus as the main source, which is then down-streamed to the load in two-stage converter architecture. The first stage is a 48V-to-12V converter to provide a 12V bus. The second stage is the high-performance 12V-to-1.xV Voltage Regulator Module (VRM) back-end converter, which is typically implemented using a multiphase buck architecture. This is done to satisfy the load in terms of power quality requirements and in particular to assure a tightly regulated supply under intensive, rapid and consecutive load transients. Multiphase interleaved buck VRM (MPVRM) enables low-voltage high-current operation [3]-[5], featuring high power density, high conversion efficiency [6]-[11] and fast dynamic response [12]-[16]. MPVRM can be ultimately used to relax the passive components requirements or to further increase the computing power. The conventional setup of a multiphase interleaved buck converter uses several phases in parallel, to power the load. Typically, a single controller IC is employed to oversee the operation of all power stages. This allows better synchronization of the signals, data acquisition with higher signal-to-noise ratio, and saves PCB area.

Single-phase controllers are predominantly realized using analog implementation due to cost-performance tradeoff. In applications of multiphase and in particular for VRM, digital control has taken the leading role. This is primarily due to the fact that modern controllers require not only performance characteristics, but also flexibility, plug-and-play and programmability capabilities, several housekeeping, communication and telemetry features. However, the added penalty of implementing a digital controller core is a non-negligible factor that stems from extreme hardware requirements to achieve the performance goals, such as high base clock frequency, overall silicon area, power consumption acquisition and control resolutions and more. These can be the result of the control architecture, implementation of the internal control blocks, peripheral units, etc.

In the vast majority of MPVRMs voltage-mode control scheme with linear compensation is applied to facilitate regulation [17]-[22]. Paralleling and voltage positioning is achieved by droop control method [23]-[29], and per-phase current information is typically used for either sharing purposes or data collection [30]-[32]. Acceleration of the control bandwidth is facilitated by switching or transitioning between linear controllers, i.e., by adjustments of the compensator's coefficients according to the loading conditions [33]-[39]. Although a version of the per-phase current information is available to the controller, current-programmed mode control approach has been excluded from commercial applications hitherto.

Parallel connection of multiple power stages operating in and out of phase, introduce several challenges ranging from current and thermal distribution to producing different voltages for the same control as a result of different physical layout. Since the phases are distributed over a sizeable portion of the PCB, meticulous tracing and interfacing are essential to carry on the power, as well as the control signals from the individual phases to the centralized controller and back. In such utilization, regulation of the per-phase current considerably reduces the complexity of the system. However, capturing the instantaneous inductor current and manipulating the phase operation accordingly may be practically prohibitive from both sensing and control aspects. Here, the advantages of Average Current-Mode (ACM) control approach are becoming more apparent [40]-[43] (especially, in the case that it can be realized without additional hardware penalty). In ACM approach, some of the building blocks are identical for both the voltage and current loops, and therefore, by using the same hardware, a significant reduction of resources is achievable.

It is therefore an object of the present invention to provide a new all-digital controller for high-performance multiphase buck VRM, including current balancing modules that enable even load distribution between the phases.

It is another object of the present invention to present in detail a new controller implementation that enables time-optimal transient recovery in multiphase regulators.

Other objects and advantages of the invention will become apparent as the description proceeds.

SUMMARY OF THE INVENTION

A mixed-signal controller for controlling a multiphase average-current-mode voltage regulator having an output connected to a load, the controller comprises:
  a. a digital voltage-sampling Analog-to-Digital Converter (ADC), based on Delay-Lines (DLs) and configured to obtain a sample of an output voltage signal and to convert the output voltage signal from analog to digital representation;
  b. a digital current-sampling ADC, based on Delay-Lines (DLs) and configured to obtain a sample of the per-phase inductor current and to convert the inductor current from analog to digital representation;
  c. a digital compensator, for voltage regulation, receiving as input the digital voltage error signal $v_e[n]$ created by a voltage loop and configured to generate a current reference signal, based on the digital voltage error signal;

d. a digital compensator for current regulation, for receiving as input a current error signal $i_e[n]$ and for generating a duty-ratio command signal, based on the digital current error signal;
e. a multiphase Digital Pulse Width Modulator (DPWM), based on DLs, for receiving as input the duty-ratio command signal for each phase, for generating a pulse-width-modulated signal (per-phase) that is fed to the gates of the converter's transistors, to thereby control the per-phase currents and output voltage supplied to the load;
f. an analog front-end, for receiving the differential measurements of the output voltage and the per-phase inductor current, where each signal is converted to a single-ended representation, such that single-ended signals are used for steady-state control via ADC measurement and the single-ended output voltage is used for transient detection and output voltage extremum detection during transient;
g. a Transient Suppression Unit (TSU), for receiving as input the digital indication signal from the analog front-end and for generating gating signals being fed to the gates of the converter's transistors during a transient event, to thereby control the current and voltage supplied to the load during the transient event;
h. a Phase Count Optimizer (PCO) unit for receiving as input the digital current reference signal and for generating an enable/disable control signal to each phase PWM output tri-state buffer; and
i. an Active Voltage Positioning (AVP) unit for receiving as input the digital current reference signal and for generating the voltage loop compensator voltage reference signal.

The controller may be implemented using standard CMOS components.

The digital voltage-sampling ADC and the digital current-sampling ADCs may be based on standard-cell technology, with no modifications.

The digital current reference compensator and each per-phase digital duty-ratio compensators may be first order compensators.

Whenever the voltage loops are decoupled, each loop and for each phase may be regulated using a single state-variable.

The controller may comprise an outer voltage loop and a per-phase inner current loops with different bandwidths.

The multiphase DPWM may comprise:
a. a single DL ring oscillator, for generating a clock signal for the per-phase PWM logic;
b. a duty-cycle logic block, for receiving as input the digital duty-cycle command and the DL ring outputs and for generating the pulse-width-modulated signal that controls the gates of the transistors.

The control signals for the gates are synchronized for interleaved operation or out of synchronization for non-interleaved operation.

The TSU may comprise:
a. a state-machine based logic block, for generating gating signals to be fed into the gates of the converter's phases transistors during transient event;
b. a fault protection logic, for fast TSU operation termination and return to DPWM operation;
c. a handoff estimation block, for receiving the pre-transient current reference signal and duty-ratio commands and for generating the estimated post transient values for the current reference signal and duty-ratio commands.

The PCO may comprise:
a. a low pass filter LPF, for receiving the current reference signal and generating a moving-average representation of the current reference signal, based on the current reference signal;
b. a state-machine based logic block, for receiving the average current reference signal and transient indication signals, and for generating controlled enable/disable signals for each of the individual phases.

The AVP may comprise:
a. a reference calculation block, for receiving the average current reference signal generated by the PCO and generating the digital reference voltage signal for the voltage compensator; and
b. a transient correction block, for receiving the current step estimation from the TSU and generating a correction signal to the calculation blocks, following a transient event.

The active number of phases may be optimized by the PCO by the steps of:
a. on power up, turning on all phases.
b. monitoring the average current reference signal at the voltage compensator output, to determine the optimal phase count;
c. taking over the current reference signal of a specific phase to be shutdown/turn-on and issuing the relevant enable signal to the output buffers;
d. return to monitoring the average current reference signal at the voltage compensator output to determine the optimal phase count;
e. during a transient event, setting all phases to be in an active mode, and returning to step b. above.

A method for voltage regulation in mixed-signal hybrid ACM controller architecture, comprising the steps of:
a. during steady-state operation of the ACM controller, simultaneously measuring the output voltage and average per-phase inductor current, once for each active phase during a switching cycle and in synchronization with the interleaved operation of a multiphase Digital Pulse Width Modulator (DPWM) that controls per-phase currents and output voltage supplied to the load;
b. using the output voltage measurement for generating a voltage error $v_e[n]$;
c. using a voltage compensator for calculating a current reference signal;
d. generating, by using calculated current reference signal and the inductor current measurement, a current error signal $i_e[n]$ which is used by a per-phase current compensator to generate a specific phase duty-cycle command $d[n]$;
e. receiving the duty-cycle command $d[n]$ by a multiphase DPWM and generating steady-state gating signals;
f. if a transient event occurs during steady-state operation, sensing the transient start time and the transient direction (loading or unloading) by transient detection sensor;
g. upon detecting a transient event, using a PCO for activating all available phases and allowing a TSU to take control over the transient gating signals and to begin counting $T_0$;
h. according to the transient direction, the TSU turns on all the phases, using low-side transistors for unloading transients, and high-side transistors for loading transients;
i. continuing step g. above until an output voltage extremum is measured by an extremum detection sensor, while the TSU stops the $T_0$ counter and if no output voltage extremum is detected, resuming the steady-state control;

j. generating the remaining gating signals timings by the TSU, based on the counter value of $T_0$ and an average duty-cycle value D, where the correction signals of the hand-off procedure are calculated based on $T_0$ and fed back to the steady-state controller;

k. completing the gating sequence by the TSU according to the values generated in step i. above;

l. upon completing a full TSU gating sequence, transferring the control over the gating signals back to the ACM controller, while resuming phase synchronization by the DPWM and steady-state operation according to step a. above.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF THE INVENTION

The present invention proposes a digital or mixed signal (that has digital and analog portions) current-programmed control for multiphase buck VRM for high-performance loads that regulates the output voltage with high accuracy, maintains current sharing of all phases for the entire operation range, and achieves optimal transient recovery for load transients. These are enabled by hybrid controller architecture that facilitates per-phase average current control (ACM) for steady-state operation and a state-space based transient oriented controller that executes time-optimal or minimum-deviation recovery for loading and unloading transients. Active voltage positioning (AVP) as well as phase shedding algorithms (i.e., decreasing the number of switches which are in operation to reduce the number of phases in operation when the load current decreases below a certain limit, thereby reducing switching losses) are embedded, covering all the required features to supply modern high-end loads. In addition to the high-end analog interface developed for accurate acquisition of the control signals, the digital core IP blocks (compensation, sharing, droop, etc.) and peripheral units (HRDPWM, ADC) are realized by combinatorial asynchronous logic, all with standard cells using HDL toward direct synthesis for IC implementation. The resultant compact controller (implemented on FPGA with total logic element count of 1700 elements for 4 phases) has been tested and successfully validated experimentally on Intel-certified hardware. The experimental prototype featured a 4-phase 12V to 1.xV buck VRM that drives an array of 7 DDR4 load modules, accommodating 100 A load transients with transition rate of 2000 A/μs, and demonstrating time-optimal recovery.

Figure 1:
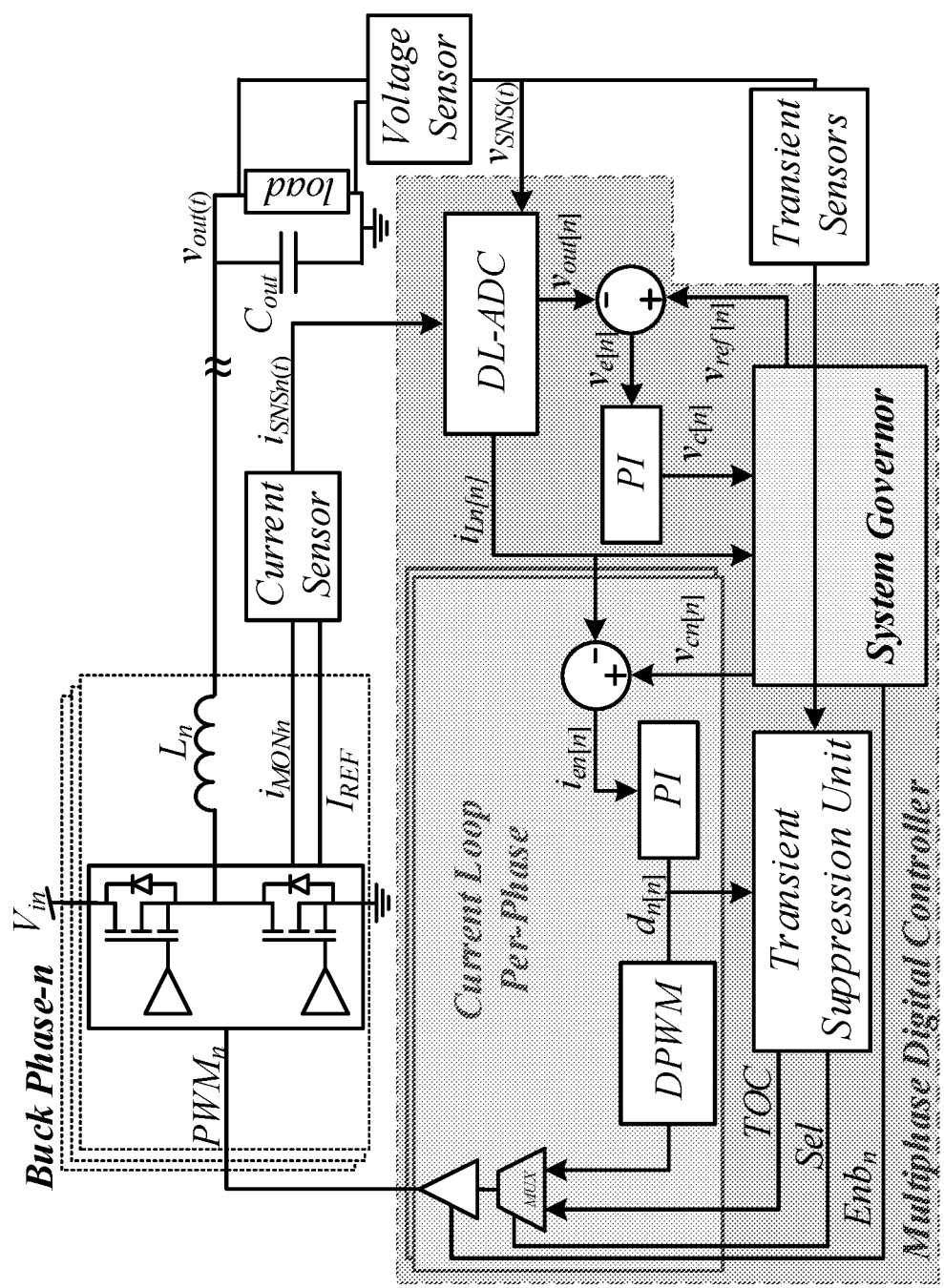
FIG. 1 shows simplified schematic diagram of a multiphase buck system.

The objective of the present invention is to introduce a new all-digital controller for high-performance multiphase buck VRM as shown in FIG. 1. The new controller includes current balancing modules that enable even load distribution between the phases. The outer voltage regulation loop encompasses a linear compensation for steady-state and small deviations, along with a large-signal transient suppression unit to mitigate large change in the load. In addition, a higher-level system governor overseas tasks of phase balancing, synchronization, load sharing, AVP and phase shedding. It is a further objective of the present invention to present in detail a new controller implementation that enables time-optimal transient recovery in multiphase regulators.

The Proposed Controller Architecture and Principle of Operation

The multiphase buck VRM controller that has been developed in the present invention and illustratively presented in FIG. 1 consists of two main control units, a small-signal ACM controller and a large-signal transient suppression unit (TSU) incorporated together into a hybrid controller architecture [44]-[53]. Each controller is designed for superior performance within its control law operation. The TSU is designed to accommodate large load changes and utilizes a nonlinear, state-variable based recovery pattern to accomplish the best possible transitioning from one loading condition to another. The small-signal controller is structured around a current-programmed linear compensation scheme and operates in fixed-frequency PWM. By doing so, it enables simpler design of the power stage, and more importantly high steady-state accuracy can be achieved as well as high static efficiency, and good thermal distribution between the phases, which is important in the context of multiphase converters. Forming this type of hybrid controller structure provides flexibility, where the tasks are separated between the compensators. Load transients are remedied with time-optimal or minimum-deviation patterns, utilizing the advantage of paralleling phases to expedite the recovery process. The design of small signal linear compensator, encompasses minimum dc error, accuracy, and current sharing. This arrangement provides simplification of the design, and at the same time steady state features are retained and significant improvement in transient mitigation is achieved by the TSU. It should be noted that by defining the task of the transient controller to bring the state variables from the old state to the vicinity of the new state, while the task of the linear control remains regulation, the issue of the controller stability is inherently resolved and can be examined by conventional tools, such as Nyquist, or phasemargirtest [53]-[56].

Figure 2:
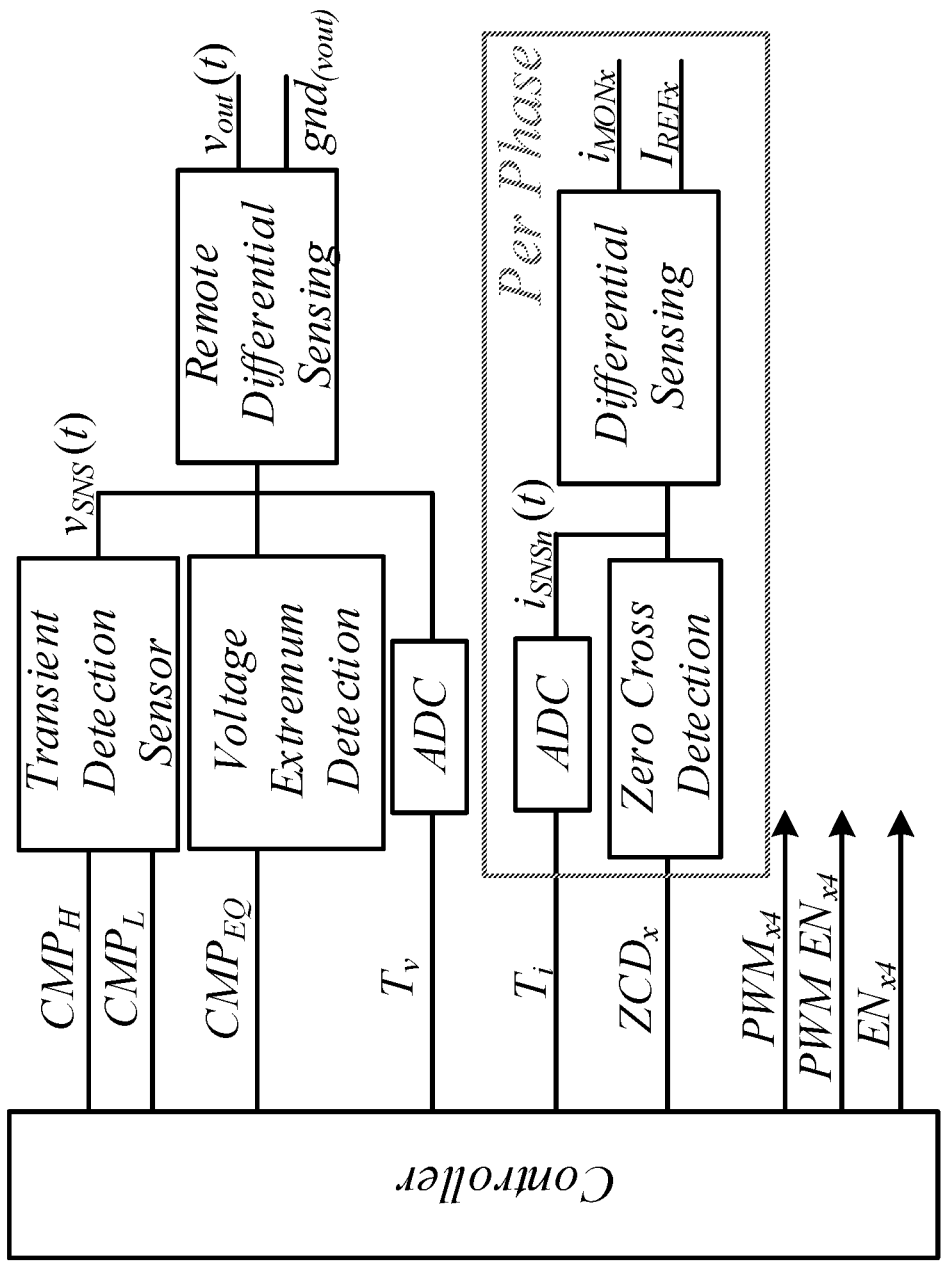
FIG. 2 shows schematic illustration of the sensing scheme for multiphase controller operation.

Sensing diagram that is required to facilitate the hybrid controller is schematically detailed in FIG. 2. This is an important interface for any high-performance VRM and particularly in multiphase applications, since reliable acquisition of circuit parameters is pivotal for issues of accuracy, rapid timing, sensitivity to changes, and accommodating noise and other disturbances. The practice employed in the present invention, as can be seen from FIG. 2, is to employ a differential-type acquisition of the state-variable signals. By doing so, the distance from the measurement point to the controller front-end is compensated. Once the signal is obtained, it is further manipulated according to the required task (regulation, detection, information, etc.). Average value readings, i.e. one sample per cycle readings, such as information of the output voltage and the current of each phase, are processed by the steady-state controller. Continuous signal information of the output voltage is further manipulated by the TSU.

Figure 3:
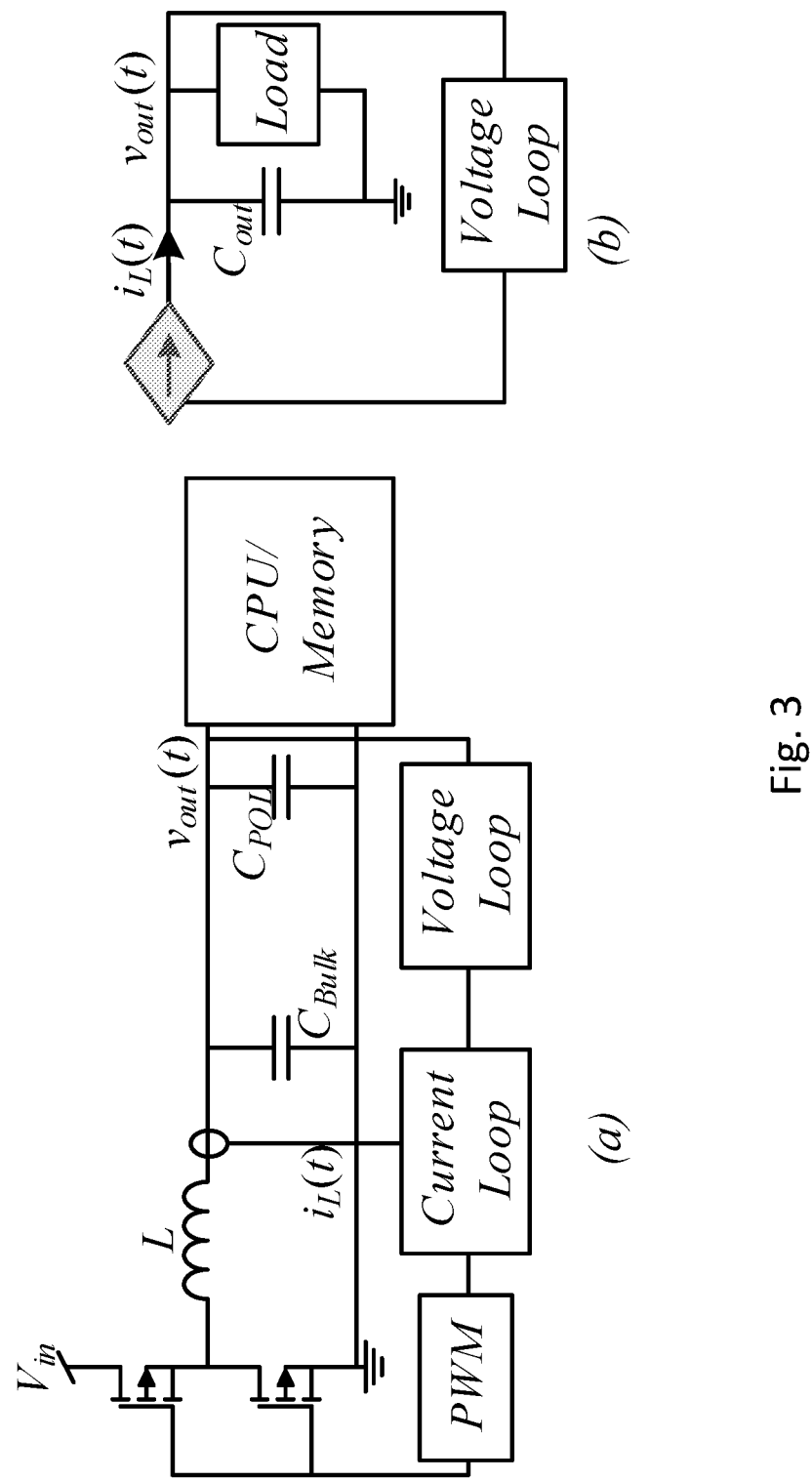
FIG. 3A shows dual loop current-controlled ACM buck VRM.
FIG. 3B shows an equivalent diagram of dual loop ACM buck VRM.

A fundamental challenge of multiphase architectures is the parallel connectivity of multiple power stages and the need to adequately distribute the efforts between them while maintaining a well-regulated voltage at the output. This mandates some form of current or load sharing protocol. In the present invention, average current-programmed mode (ACM) control for the operation of the steady-state compensation scheme has been pursued as can be seen in FIG. 3A. Under the assumption that the control bandwidth of the current loop is sufficiently wider than that of the output voltage, the individual power stages that feed the output capacitance can be treated as controlled current sources as in FIG. 3B. This enables multiple converter phase paralleling, simple adjustment of the phase currents, and therefore current sharing. Equal currents eventually result in even thermal distribution between the phases at no additional cost, which is important to multiphase applications.

Figure 4:
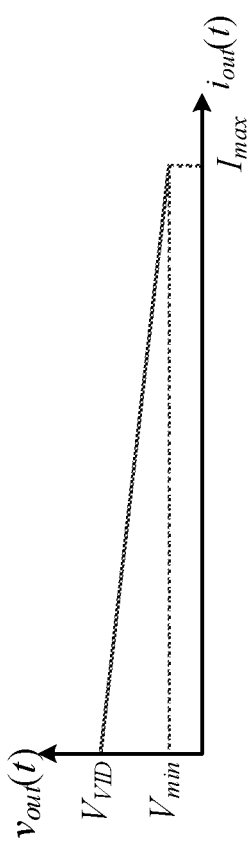
FIG. 4 shows active voltage positioning VID curve required for high-end loads.

Additional important feature of multiphase controllers required by the load due to the thermal restrictions when operating at high current [57], is active voltage positioning (AVP). A typical droop curve that represents the target $v_{out}(t)$ level as a function of the load current $i_{load}(t)$ is shown in FIG. 4. The output voltage level reduces as a linear function of the load current where $V_{VID}$ defines the nominal output voltage at no-load conditions, and $V_{min}$ is the required voltage at $I_{max}$. Droop control is implemented by shifting down the target reference voltage with load increase, and can be expressed as:

$$v_{ref}[n] = V_{VID} - R_{VID} \cdot i_{sum}[n] \qquad (1)$$

where $v_{ref}[n]$ is the voltage loop reference, $V_{VID}$ and $R_{VID}$ are the user selected AVP parameters to fit the desired $V_{VID}$ curve, and $I_{sum}[n]$ is the digital value of the total converter current. It should be noted that in order to avoid oscillations at the output and since the droop relates to the steady-state voltage level only, its bandwidth is significantly lower than the response of the voltage control loop.

Figure 5:
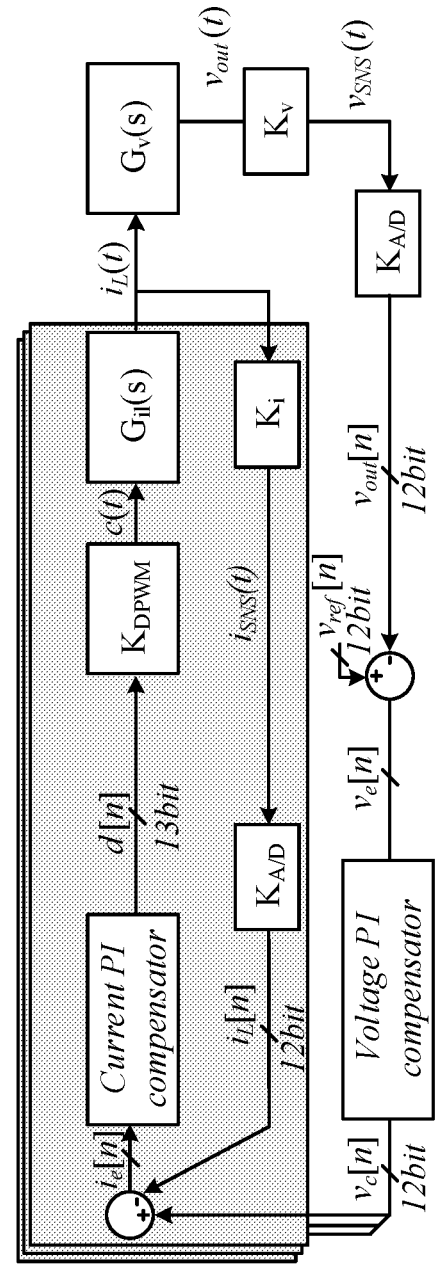
FIG. 5 shows conceptual block diagram of the multiphase buck ACM control system.
Figure 6:
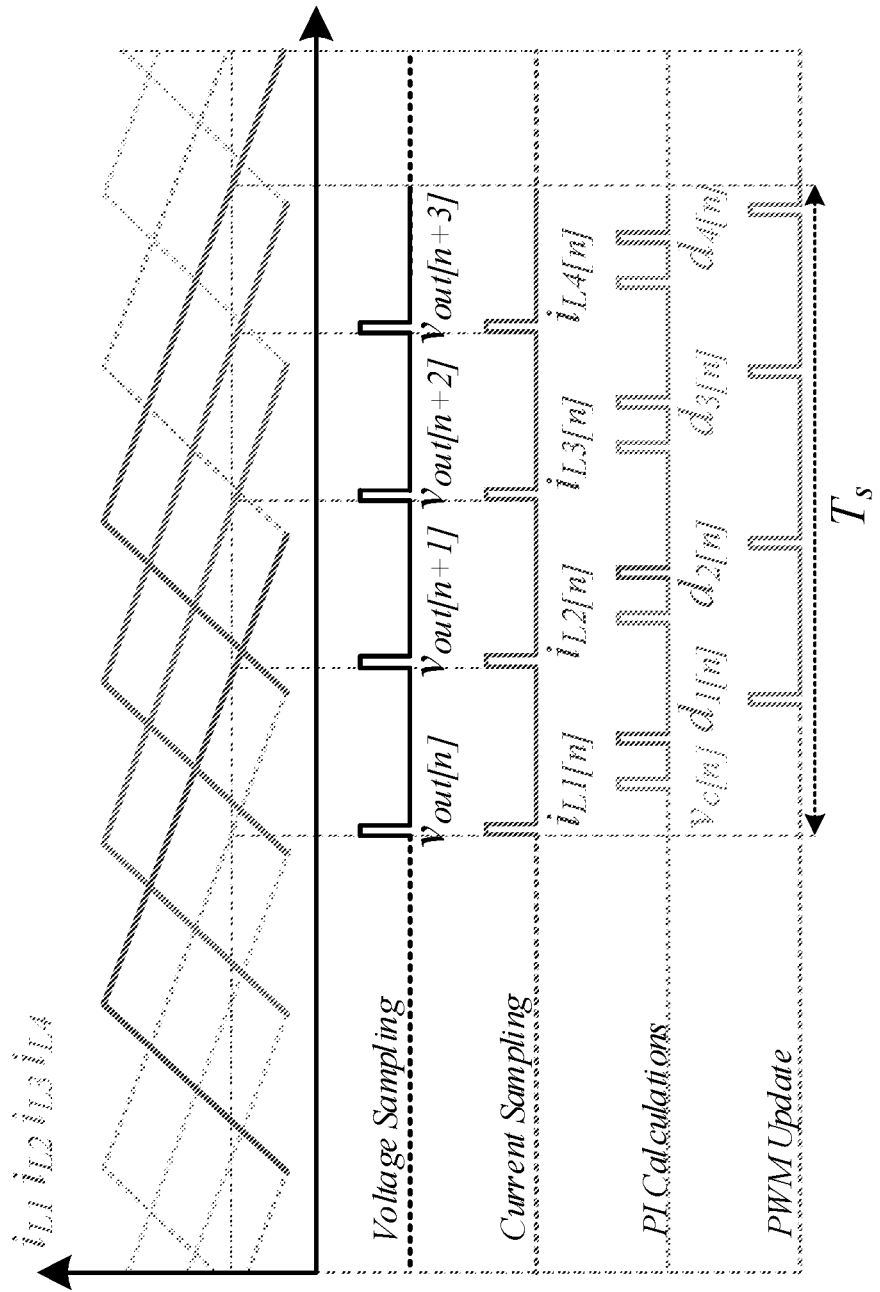
FIG. 6 shows multiphase ACM controller timing sequence diagram of key blocks, during steady-state operation.

The principle of operation of the ACM controller is described with the aid of FIG. 5 and FIG. 6, which show the conceptual block diagram of the ACM controller and its timing sequence diagram during steady-state operation respectively. Since the present invention focuses on all-digital implementation of the controller, the description is carried out with sample-data domain notations. The voltage loop creates a digital reference $v_c[n]$ for the inner current loops based upon the error signal $v_e[n]$ as given in (2):

$$v_e[n] = v_{ref}[n] - v_{out}[n] \qquad (2)$$

where $v_{ref}[n]$ is the AVP generated reference and $v_{out}[n]$ is the sampled output voltage. The current error signal $i_e[n]$ is then calculated per-phase using the sampled average inductor current $i_L[n]$ of each phase. The current error signal $i_e[n]$ used as the input for the current loop compensator, which generates the duty command for the DPWM module $d[n]$, and a pulse width modulated signal $c(t)$ is formed.

In the classic approach for ACM control, the samples of $v_{out}[n]$ and $i_L[n]$ (FIG. 5), are sampled in a successive manner so that the resources of high-performance hardware such as ADC units can be shared, to save on power consumption and area. Furthermore, it is a common practice to position the sampling events away from switching actions to increase the measurement signal-to-noise ratio. In inter-leaved multiphase systems however, switching events are scattered along virtually the entire switching cycle Ts and become more frequent with the number of phases, resulting in limited time slots suitable for data acquisition. To overcome this obstacle, the present invention formulates a unified data acquisition sequence that synchronizes per-phase measurements and gains the benefit of increasing the number of allowed interleaved phases to be limited by the acquisition time alone. Since the realization of the ADCs hardware in the present invention is carried out by delay-lines and combinatorial circuits as previously described in [58], the hardware penalty per phase is negligibly small.

A timing sequence diagram for the ACM controller is presented in FIG. 6, where $v_{out}[n]$ and $i_L[n]$ are both sampled at the same time. To utilize the enhanced bandwidth option of multiphase operation, the reference $v_c[n]$ signal is updated by the voltage loop compensator, the relevant phase duty command $d_n[n]$ is generated by the individual current loops and updated to its DPWM port at the beginning of each phase. By sampling $v_{out}[n]$ and $i_L[n]$ simultaneously at a fixed location within Ts, the timing logic in FIG. 6 can be duplicated and applied to accommodate any number of phases, limited by the data acquisition capabilities of the controller hardware.

Figure 7:
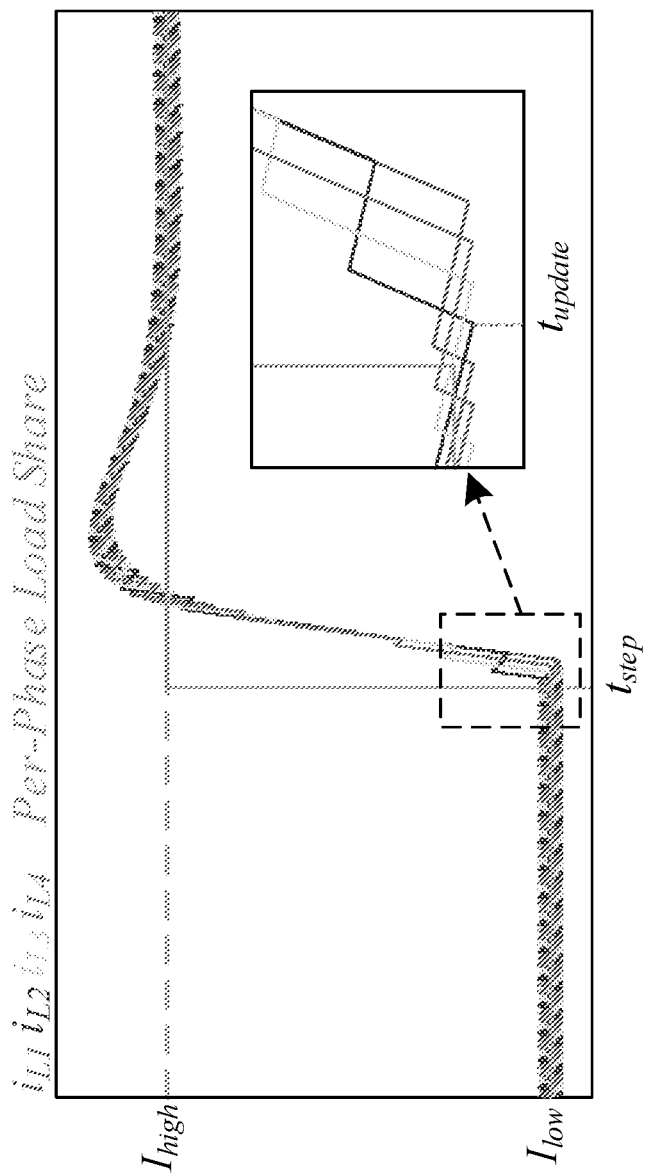
FIG. 7 shows loading transient recovery of four phases interleaved buck converter controlled by linear compensation scheme.

Small load changes, defined within the range of the inductor current ripple (approximately 30% of the rated current) do not trigger the operation of the TSU and are accommodated through the steady-state compensation. FIG. 7 shows a typical response of the linear controller to a loading transient with four-phase operation (results obtained from PSIM simulation). Prior to the point $t_{step}$ the controller is in steady-state, where each phase provides $1_{low}$ to the output, sharing the load equally. At $t_{step}$ the load changes so that each phase is required to carry $1_{high}$. Zoomed-in frame in FIG. 7 shows that the load step takes place between switching cycles of two adjacent phases. The small-signal compensator responds to the transient event immediately as the next closest phase cycle begins, at $t_{update}$. This is a much quicker response than the conventional practice, where the controller waits for a full switching cycle to complete. During the transient period, and under any transient conditions the ACM architecture of the small-signal compensator maintains current sharing between the phases, reducing the current sharing convergence time to zero, and the output current is fully shared when the system is back to the steady-state operation.

Large-Signal Compensation Scheme

Figure 8:
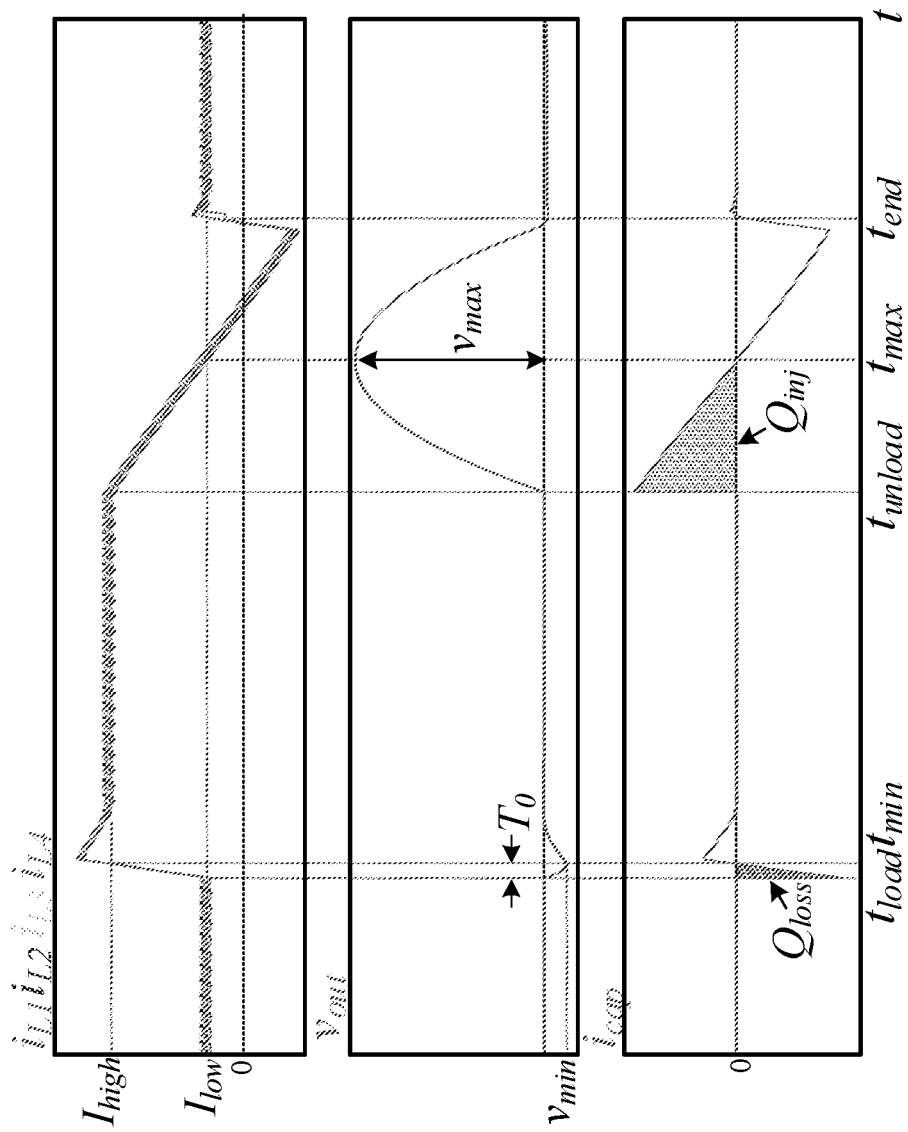
FIG. 8 shows large-signal compensation waveform during loading and unloading transient events.
Figure 9:
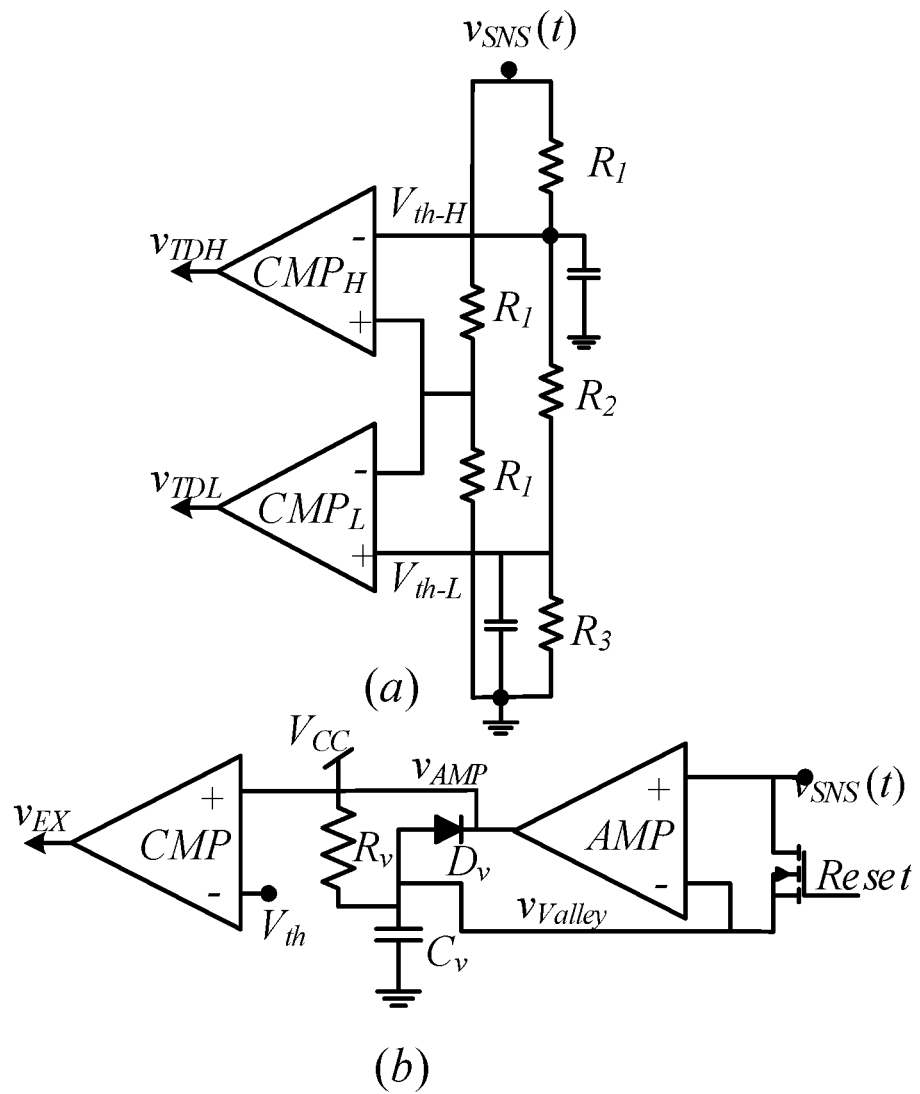
FIG. 9A shows large-signal compensation sensors with transient detection sensor.
FIG. 9B shows large-signal compensation sensors with output voltage extremum point detector (minimum)

Hybrid controller architecture facilitates a large-signal recovery pattern to suppress extreme transient events which exceed the regulation capabilities of the linear, small-signal compensator. Effectively, the limitations of the transient-oriented controller are the slew-rate imposed by the passive components, and the delays of the system (detection, calculation etc.) [48], [59]-[62]. Typical waveforms of transient recovery are depicted in FIG. 8 (obtained by PSIM simulation), demonstrating a loading transient event, followed by an unloading transient event as the load changes between the values of $1_{low}$ and $1_{high}$, respectively. The details of the transient and extremum detection sensors as used in the present invention are shown in FIG. 9, and are based on [43].

Prior to the first transient event, the output voltage is within the steady-state window defined by $V_{th-H}$ and $V_{th-L}$ (FIG. 9(a)) and controlled by the steady-state controller. At the time of $t_{load}$ the load increases to $1_{high}$, and the output voltage decreases, which triggers CMPL. Past this point, the operation of the steady-state controller has been halted, the large-signal compensator takes over the control of the gating outputs and forces all available phases to turn on. The time duration ($T_0$) between transient beginning and the point of output charge balance, is measured using a counter. The charge balance point manifested at the output voltage as an extremum point. Given that $T_0$ is attained by the controller the rest of the operation can be completed with a single on-off switching cycle as demonstrated in [44]-[49], to fully recover the output voltage back to its nominal value. In the unique case of loading transient, where the small inductors greatly increase the total system current slew rate producing faster transient response and virtually no voltage drop at the output, a minimum deviation approach can be implemented instead of the full TOC operation. Beyond this point, the control is returned back to the steady-state controller that maintains the operation at the new steady-state conditions.

In opposite to the loading transient event, the case of unloading transient present a more challenging task due to the low current slew rate which prolongs the transient recovery time. The result of the current slew rate mismatch is shown in FIG. 8 as the voltage overshoot caused by the unloading transient $v_{max}$ is far greater than the voltage under-shoot $v_{min}$, therefore a longer off time is required to bring the output voltage back to its nominal value. In some cases, the output capacitor is actively discharged by the multiphase VRM as the inductor currents turn negative to further induce the transient mitigation process. The output capacitor current $i_{cap}$ shown in FIG. 8 can also demonstrate the differences between the two transients as the charge loss during loading transient $Q_{loss}$ is recovered quickly in comparison to the injected charge $Q_{inj}$ in the unloading transient case.

Figure 10:
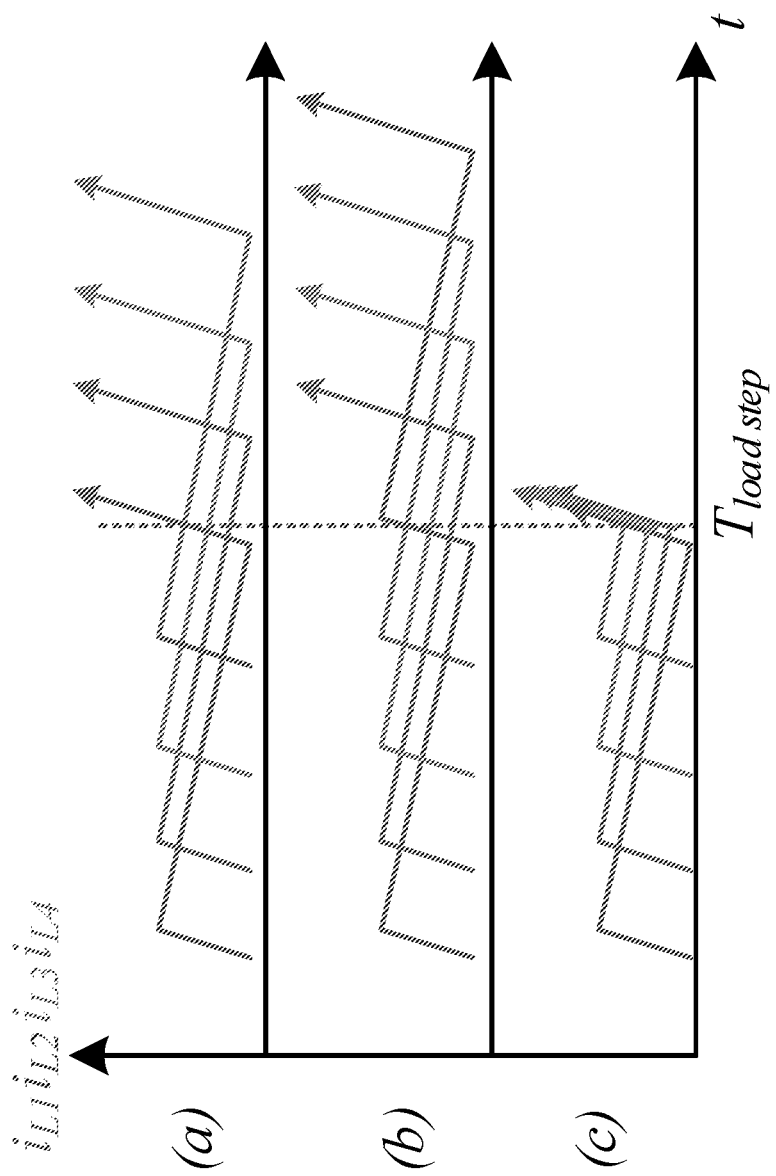
FIG. 10 shows phase synchronization during transient current ramp up.

The current ramp up/down phase in the large-signal compensation can be implemented with different levels of phase synchronization during transient. FIG. 10 shows three options for ramp-up initiation with and without phase synchronization, each with its pros and cons. The first option in FIG. 10(a) maintains phase synchronization while also addressing the transient with the closest phase available upon detection, in this case the dashed line phase continues its ON state immediately upon transient detection. The second option in FIG. 10(b) is to maintain full phase synchronization during transient when each phase is turned on at the beginning of its next cycle respectively. The third option is to turn all available phases as soon as transient event is detected, as a result, this method presents the poorest phase synchronization, nevertheless the transient performance is superior in comparison to the first two methods. When looking into the current sharing attribute during transient time the latter option maintains good current sharing, while the worst current mismatch possible is according to the size of the current ripple.

The method described in FIG. 10(c) is chosen due to the fastest transient performance as well as current sharing attributes. Another advantage of this method is that during a transient event, the system can be treated as a one single phase buck, with effectively increased bandwidth and with effective inductance of $L_{eq}$, given by $L_{eq}=L_{ind}/N$ (N represents the number of active phases).

Figure 11:
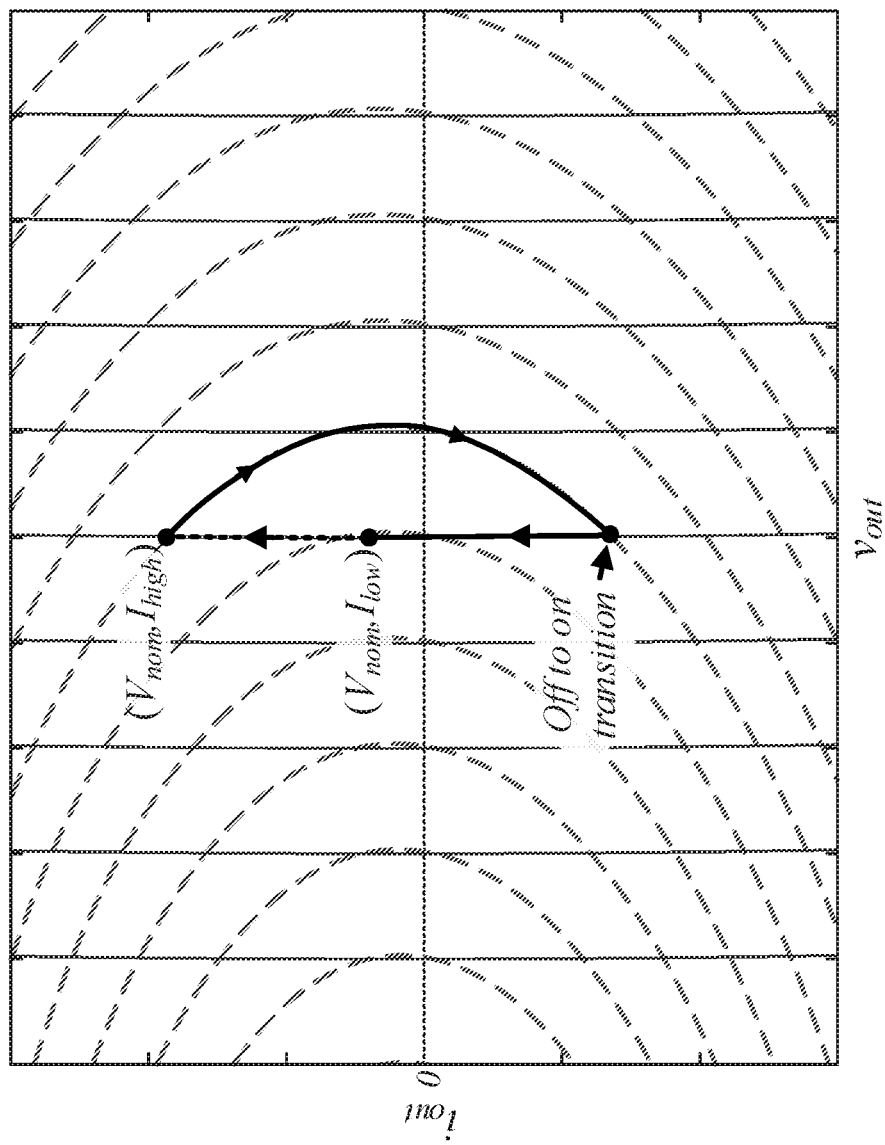
FIG. 11 shows state-space trajectories of multiphase buck in loading and unloading transients.

When treating the multiphase converter as single phase buck the state-space trajectories can be easily extracted as shown in FIG. 11. The dashed lines mark the OFF state trajectories, and the ON state trajectories are rendered as the vertical straight lines because of the small inductor size and large output capacitor. The loading transient between the two steady-state current of $1_{low}$ and $1_{high}$ is marked with the bold dashed line in FIG. 11, the loading transient can be completed with a single on cycle and during that time the output voltage remains virtually constant, therefore the full TOC operation can be reduced to a minimum deviation approach without extending the recovery time. Dissimilar to the latter, the unloading transient response between $1_{high}$ and $1_{low}$ include the full TOC approach starting with a long OFF state which can be completed with negative inductor current, followed by short ON state to return the system to $1_{low}$ in the shortest possible time. The operation for both loading and unloading transients is verified experimentally later in the description.

Advance Control Features and Practical Implementation Aspects

Figure 12:
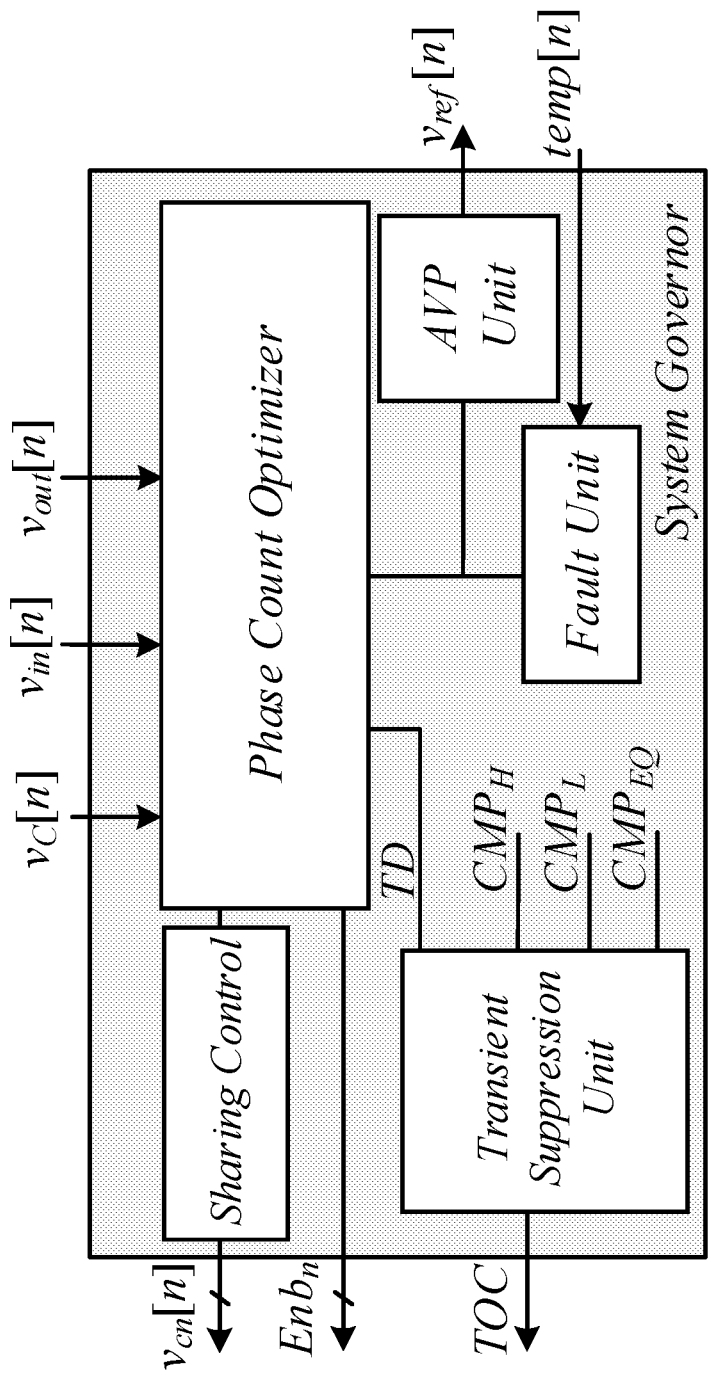
FIG. 12 shows system governor block diagram.

In addition to the regulation requirements carried out by the hybrid architecture, and described in previous sections, state-of-the-art multiphase controllers are required to accommodate high-performance loads with additional features like AVP, Phase shedding/adding and Fault management. In this present invention, the additional features are carried out by the system governor unit shown in FIG. 12. The system governor collects information of the following system variables: input voltage $v_{in}[n]$, output voltage $v_{out}[n]$, temperature temp[n], and the voltage loop output $v_C[n]$.

AVP Function Implementation

Figure 13:
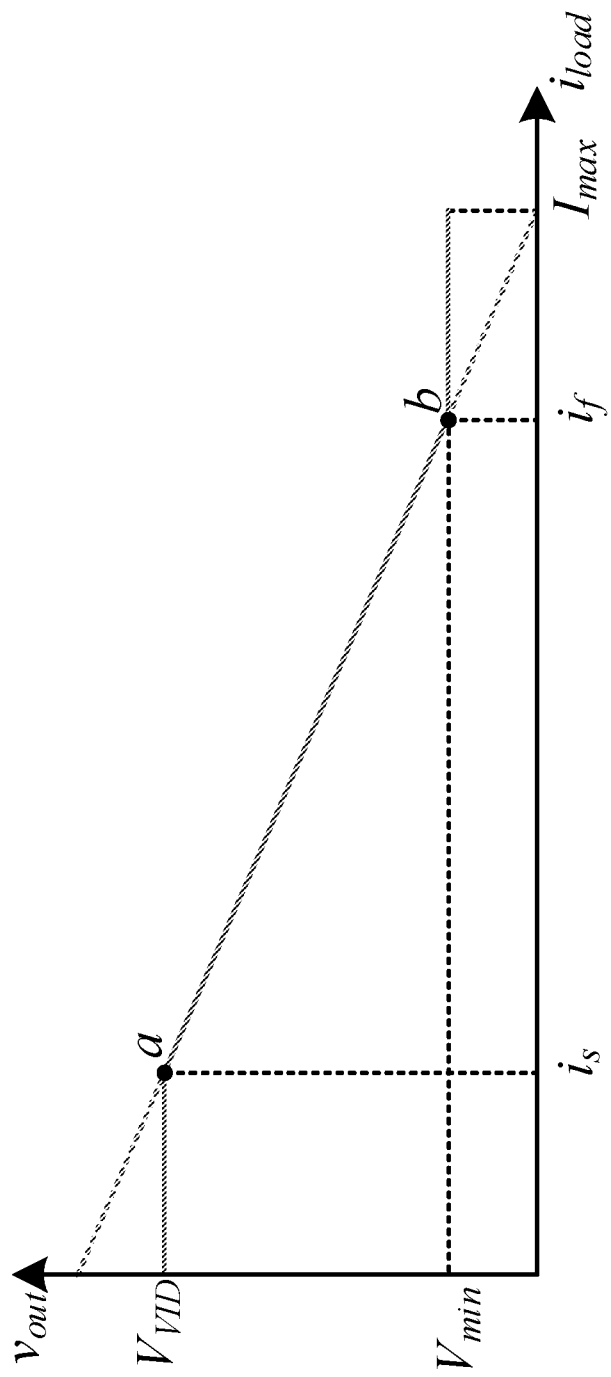
FIG. 13 illustrates a programmable piecewise linear AVP function.

The linear AVP function (as shown previously) is realized in analog controllers with relatively moderate design efforts, the implementation of more complex functions like piece-wise-linear or non-linear functions may increase the controller design complexity drastically. Digital control used in most state-of-the-art MPVRM controllers can be utilized to implement complex AVP functions as shown in FIG. 13, reducing design complexity and offers a real-time calibration of the AVP function. The digital AVP function implemented in this present invention is shown in FIG. 13, during low loading conditions the output voltage remains constant until the load current surpasses the bottom threshold $i_s$, from this point and up to a load current of $i_f$ the output voltage follows a constant output impedance $R_{AVP}$. For load currents larger than $i_f$ and up to $l_{max}$ the load maximum current, the output voltage remains constant and equal $V_{min}$.

Despite its advantages over the analog implemented AVP unit, the digital AVP unit may encounter resolution issues where the minimal output voltage step is limited by the voltage ADC sampling resolution. Since the unity change in $v_{ref}[n]$ is translated to a small step in $v_{out}(t)$ the smooth load line profile of FIG. 13 is realized in a discrete manner. Enhancing the ADC resolution in order to solve the AVP profile discretization is limited by the system PWM resolution to prevent limit-cycle oscillations. Filtering the AVP result improves noise immunity and profile discretization with minimal impact on the bandwidth of the AVP function.

Figure 14:
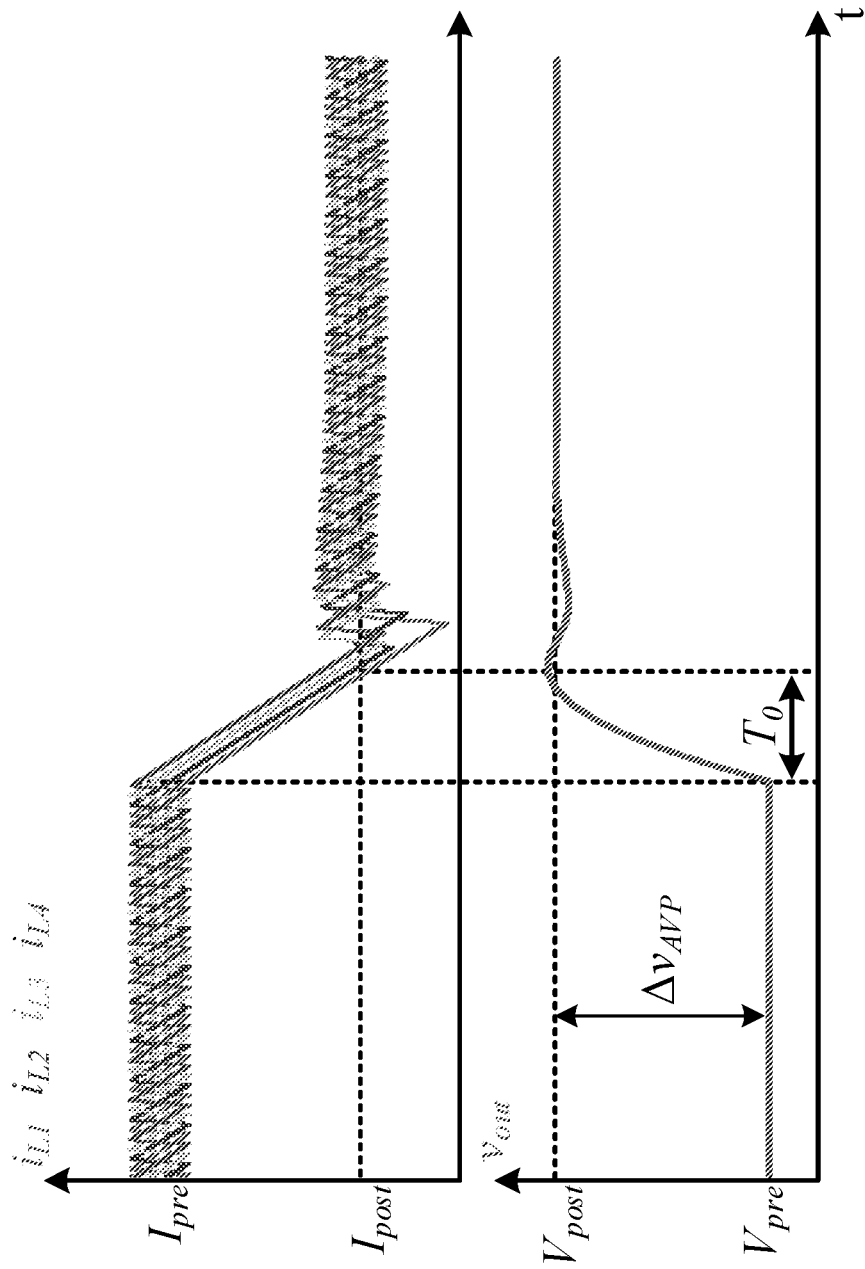
FIG. 14 illustrates an AVP function implementation for minimum deviation control recovery.

Traditional AVP operation bandwidth is usually relatively low in comparison to the voltage loop compensator bandwidth, this is done to prevent undesired voltage oscillations between the loops and to assure tight voltage regulation during steady-state operation. In modern MPVRMs, however, the load is capable of fast and large transients that require a non-linear solution to ensure the load line profile FIG. 13 is kept at all times. FIG. 14 demonstrates the AVP unit non-linear operation during a large unloading transient event. Ideally when the minimum deviation transient mitigation is complete, the output voltage is steered by the linear controller to its desired post-transient level ($V_{post}$), as prescribed by the AVP unit. Since transient events may be extremely short due to small inductor values used in high performance MPVRMs, the load current step size can be hard to obtain from the relatively slow steady-state measurements, thus the time of the non-linear mitigation operation $T_0$ can be used to accurately estimate the current step and change $v_{ref}[n]$ accordingly.

Phase Count Optimizer

In this present invention, the load current information is extracted from the inner current loops reference, $v_c[n]$, which is the output of the outer voltage loop, as shown in FIG. 1. The value of $v_c[n]$ is fed into a digital LPF (implemented as a moving-average) to ensure that a singular calculation or sampling error will not trigger the Phase Count Optimizer (PCO). Since phase shedding and adding procedure for efficiency enhancement purposes is a relatively slow process, the delay caused by the filtering stage is negligible. The filtered result is the input to a Look-Up Table (LUT) which determines the optimal number of phases for a given $v_c$ value. This LUT can be re-programmed to accommodate changes in the power stage or to account for components value drifts due to aging and temperature.

Figure 15:
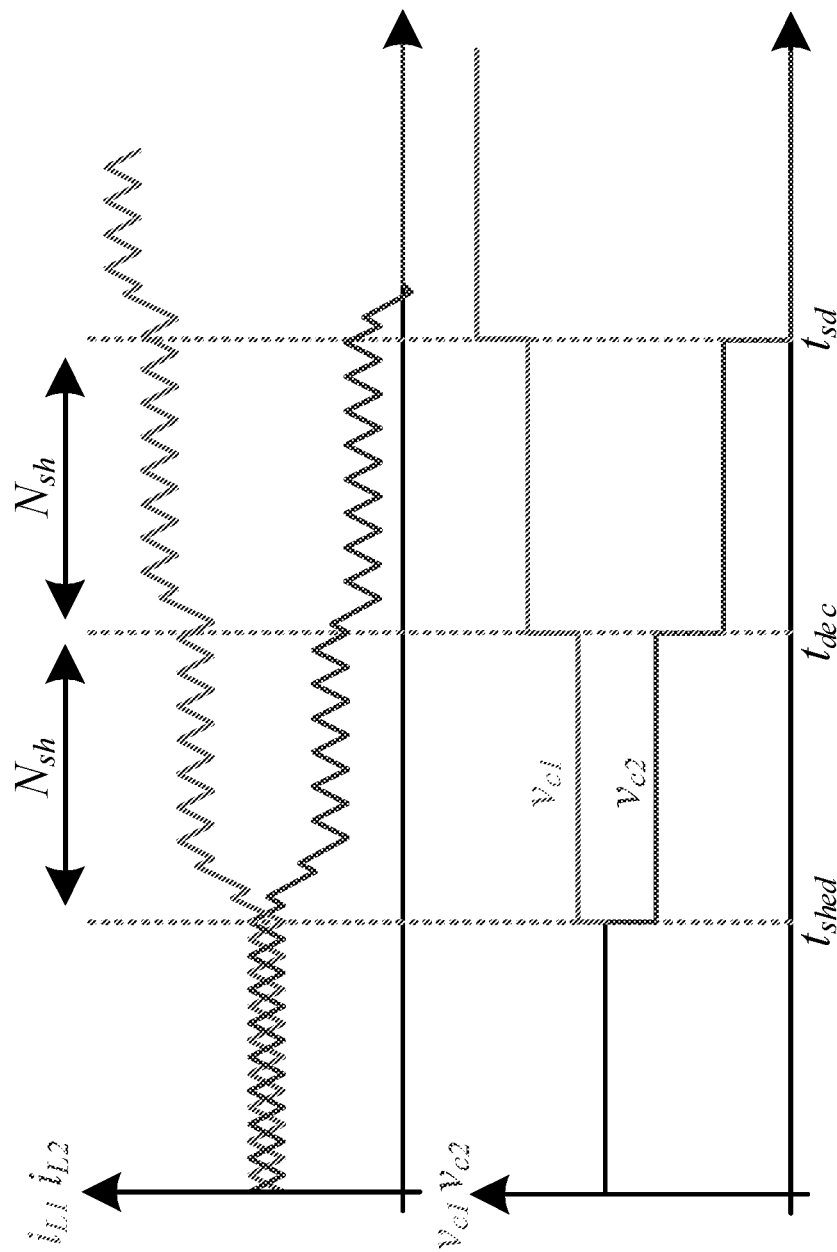
FIG. 15 illustrates PCO operation in a supervised phase-shedding procedure during steady-state.

In case of load release, a phase shedding procedure carried by the PCO is initiated to optimize the converter efficiency. For simplicity, the procedure is described for a 2-to-1 transition but applies for any other phase shedding transitions. As can be seen in FIG. 15, prior to any change in the number of active phases, current balancing is enforced by the ACM control scheme. First, the reference to the inner current loop of the shedded phase is bypassed with a value equals to $v_{shed}[n]$, while the remaining phase operates in the original dual-loop configuration. Upon initialization, $v_{shed}[n]$ equals to $v_c[n]-1$ and gradually decreased every $N_{sh}$ switching cycles. Since the inner current loop of the shedded phase remains active, its inductor current tracks $v_{shed}[n]$ which allows supervised current ramp-down. The remaining phase, which operates in dual-loop configuration, ramps up its current to compensate for the shedded phase, as shown in FIG. 15. This results in a gradual phase shedding scheme with no voltage deviations or current spikes. Once $v_{shed}[n]$ reaches zero, the shedded phase is completely turned-off by the controller. The duration of each step can be altered but must be sufficiently long to allow the remaining phase to ramp its current, as shown in FIG. 15. For an increase in the load requirements, similar procedure takes place in which the added phase's inner loop reference is gradually ramped up every Nsh switching cycles. Since the existing phase operates in dual loop configuration, its current is adjusted to compensate for the increased current provided to the load and to maintain tight voltage regulation. The phase adding procedure is complete when $v_{shed}[n]$ is equals or greater than $v_c[n]$, which ensures that the currents of both phases are equal.

Other than optimizing the steady-state efficiency the PCO additionally function during transient events. Upon transient detection, the linear controller is bypassed and the drive signals to the power switches are produced by the non-linear controller. Therefore, the PCO sets the maximal number of phases upon transient detection to shorten the transient duration by multiplying the effective current slew rate. This operation ensures then best achievable transient performance of the non-linear TSU. After the transient event completion, the PCO return to steady-state operation, shedding or adding phases according to the load status.

Post Transient Handoff Procedure

The transition from the non-linear controller operation executing TOC or minimum deviation control to the small-signal based linear controller is referred to as Hand-off. It comprises a set of adjustments carried by the TSU to the reference control signals as well as to the duty-cycle commands of the different phases. The hand-off procedure from non-linear control operation in a lossless converter can be executed by assigning the pre-transient control values, while in practice if the post-transient control signals (both internal and external) are not modified to compensate for the losses in the system, additional settling transients may occur. In this present invention, ACM control scheme has been realized (Error! Reference source not found.) for the steady-state operation, therefore both the reference to the inner current loops, $v_c[n]$, as well as all duty-cycle commands are modified based on the duration and the polarity of the transient event. Once the hand-off procedure is initiated, the controller operates in open-loop for a single switching cycle with the modified duty-cycle before closed-loop operation is resumed.

Upon transient detection, the duty-cycle of the leading phase, $D_0[n]$, and the current loop reference, $v_{co}[n]$ are sampled and stored in dedicated registers. For a loading transient, the modified duty-cycle, $D_{tr}$, is calculated by the following:

$$D_{tr} = D_0[n] + k \cdot T_0 \frac{V_{in} - V_{out}}{L}, \quad (1)$$

while for an unloading transient the following is used:

$$D_{tr} = D_0[n] + k \cdot T_0 \frac{Vout}{L}, \quad (2)$$

where k is a proportional constant derived during the design process and $T_0$ is the duration of the transient mitigation period estimated by the TSU. By performing a current-sweep test of the multiphase converter, operation of the entire load range is validated and duty-cycle values are stored in the system for a wide range of loading conditions. Plotting these values as a function of the load current and extrapolating results in a linear curve with a slope equals to k. The inner current loops reference is also updated in a similar manner as in (3)-(4), taking into account the sampled $v_{co}$ value and the load step information stored as $T_0$. Once closed-loop operation is resumed, fine adjustments are performed by the steady-state controller to the duty-cycle commands to achieve accurate current balancing and maintain steady-state operation.

Multiphase DL-DPWM Module

Figure 16:
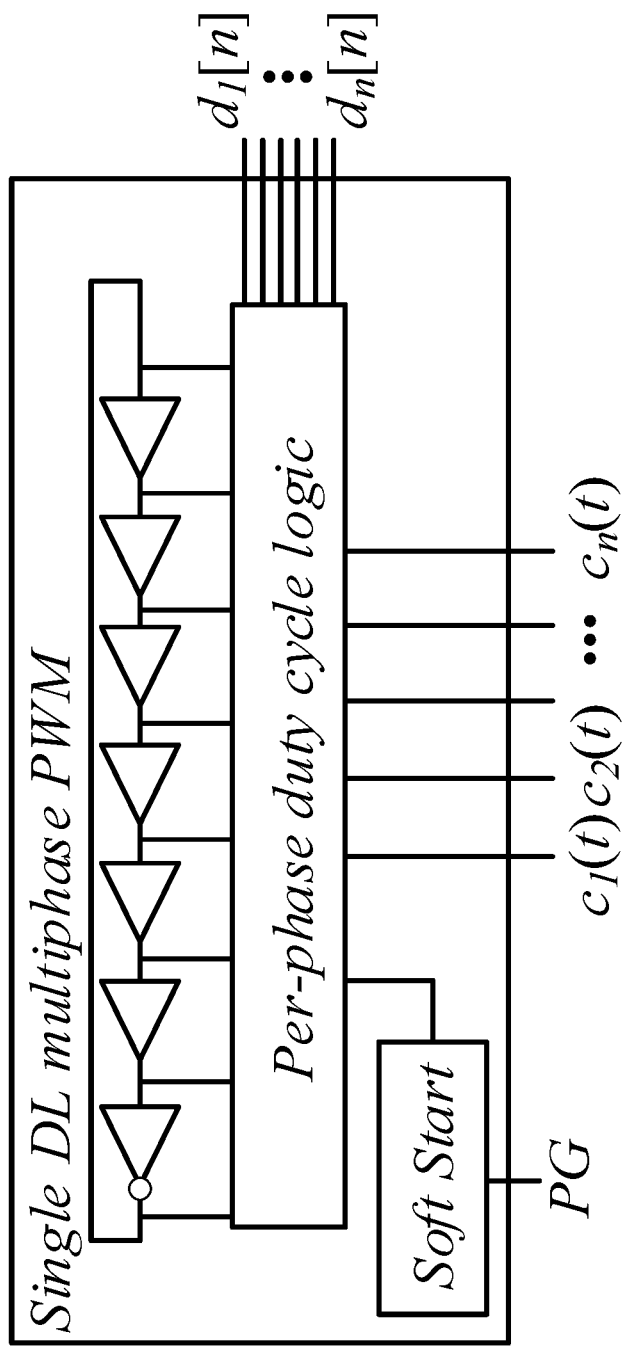
FIG. 16 shows single DL multiphase DPWM module with built-in soft start unit.

Practical implementation of multiphase systems suffers from any imbalance between the different phases impacting the current sharing quality. A DPWM model based on multiple DL realization, especially on an FPGA custom designed modules, can introduce non-identical PWM signals for two different phases under the same duty command. The signal DL multiphase DPWM realized in the present invention as shown in FIG. 16 is based on a single DL ring oscillator to generate the PWM signal to all the phases. Given a duty command $d_n[n]$ a $c_n(t)$ signal is generated using the DL ring oscillator and the duty cycle logic. The single DL design cancels out the system sensitivity to both synthesis and silicon level differences between multiple modules. In the presence of very small inductors and very large output capacitance in multiphase systems, a soft start unit is essential to prevent any startup current or voltage overshoots and to bring the system into the steady-state thresholds. The soft-start unit is incorporated into the DPWM module (FIG. 16) and provides a power good indication after the soft start process is completed.

Simulation and Experimental Validation on Multiphase Buck Converter

The multiphase buck VRM controller operation has been validated using a 12V-to-1.xV four-phase multiphase buck converter, an experimental prototype with all the analog front-end peripherals has been built and tested. The converter parameters are shown in Table I. Each DDR4 module capable of sourcing or sinking up to 14 A and the gating signal pattern is generated by a signal generator, asynchronous to the controller operation. The load slew-rate utilized in the experiments is 2000 A/μs. The digital hybrid controller architecture, system governor, and custom-made peripherals such as the DL-ADC and single delay-line multiphase PWM has been entirely implemented on a Cyclone V FPGA. The converter parameters are shown in Table I below.

TABLE I

| Parameter | Value/Type |
|---|---|
| Input voltage $V_{in}$ | 12 V |
| Power Stage | SiC820, 70 A |
| Inductor | 120 nH |
| Output capacitance, $C_{out}$ | 5 mF |
| Switching frequency, $f_{sw}$ | 900 KHz |

Figure 17:
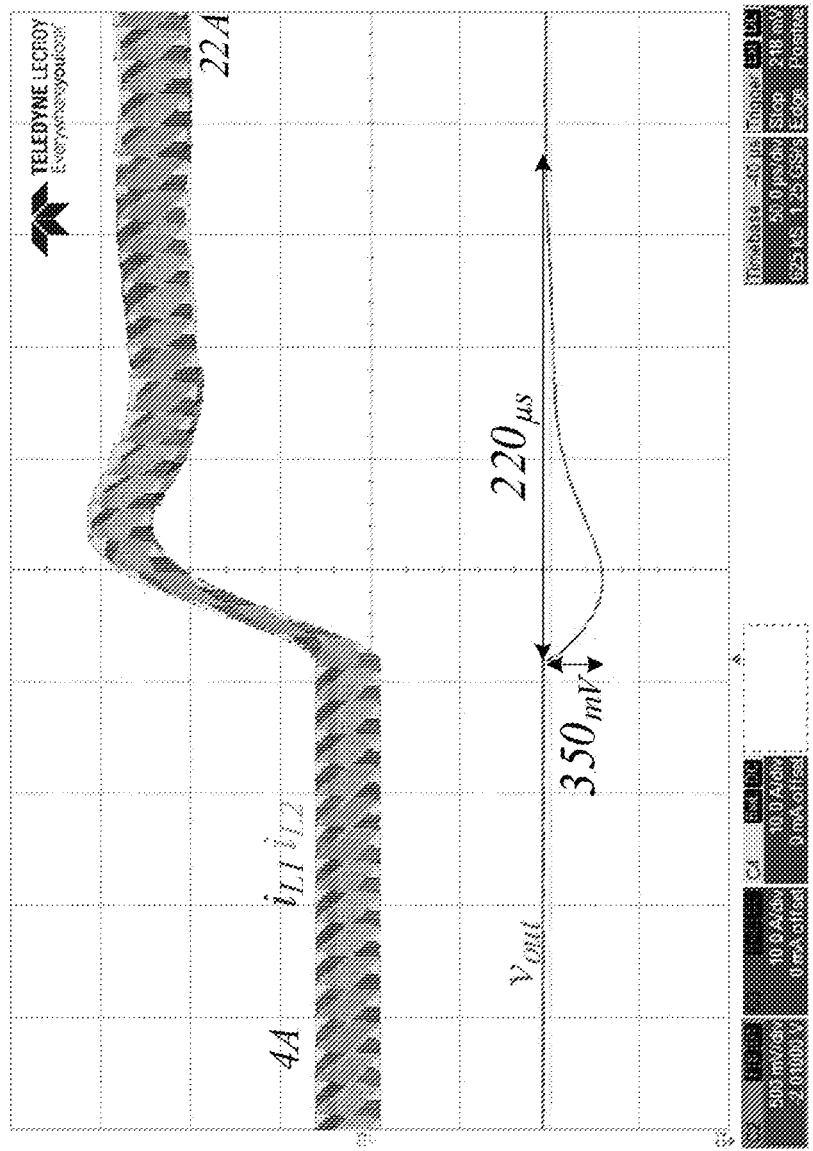
FIG. 17 shows small-signal compensator operation during a 16 A→88 A loading transient event.

FIG. 17 shows the transient response handled by the small-signal compensator of a loading transient event from 16 A to 88 A. $i_{L1}$ and $I_{L2}$ represent the inductor currents of phase 1 and phase 2 respectively, stepping up from the average current of 4 A each to 22 A each as the load changes. The output voltage at the load point is denoted as $v_{out}$ and shows a maximal voltage deviation of 350 mV and a full recovery period after 220 μs. The small-signal controller maintains current sharing between the phases for the entire transient mitigation period.

Figure 18:
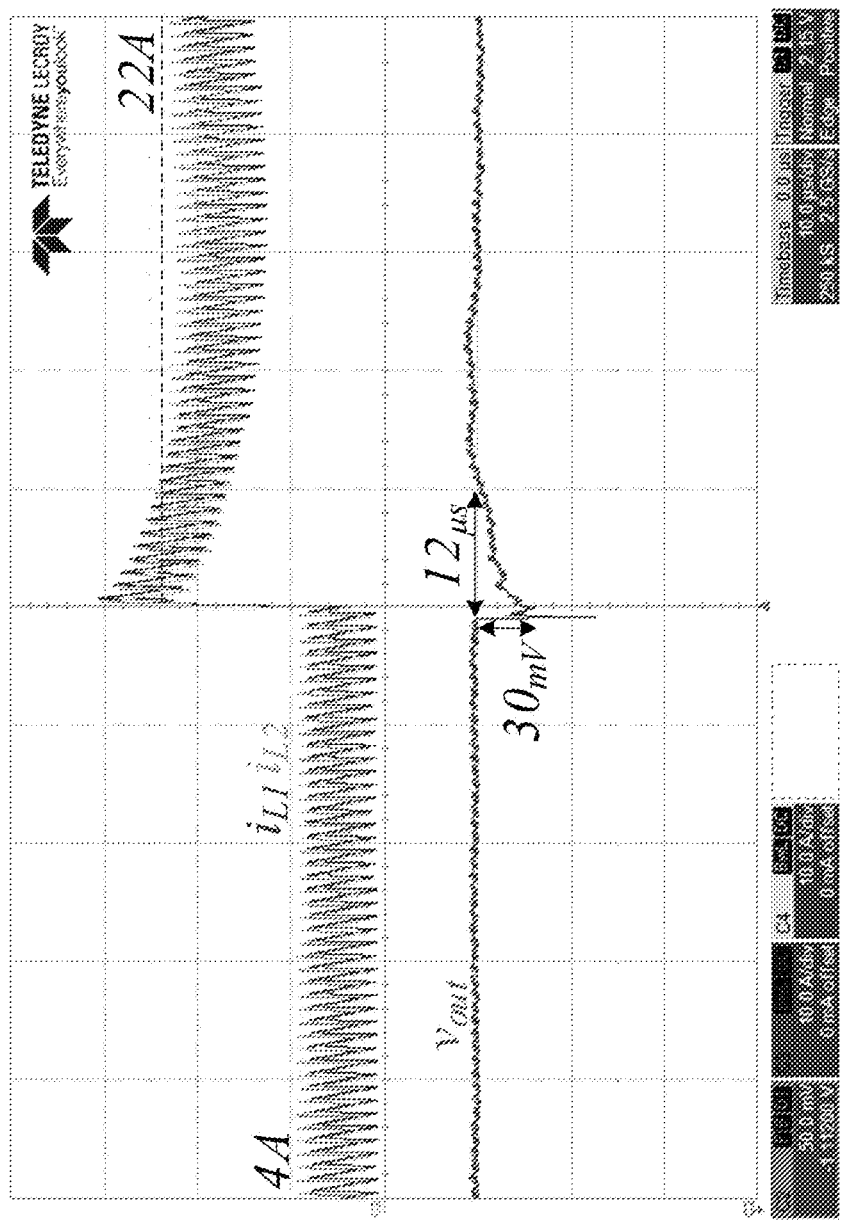
FIG. 18 shows large-signal compensator operation during a 16 A→88 A loading transient event.

In FIG. 18 the large-signal compensation scheme is activated to mitigate a loading transient event from 16 A to 88 A. Here, the controller realizes minimum-deviation recovery profile with output voltage $v_{out}$ deviation of 30 mV and recovery to steady-state within 12 μs. TSU operation demonstrates excellent current sharing during transient and during the transition back to the steady-state controller.

Figure 19:
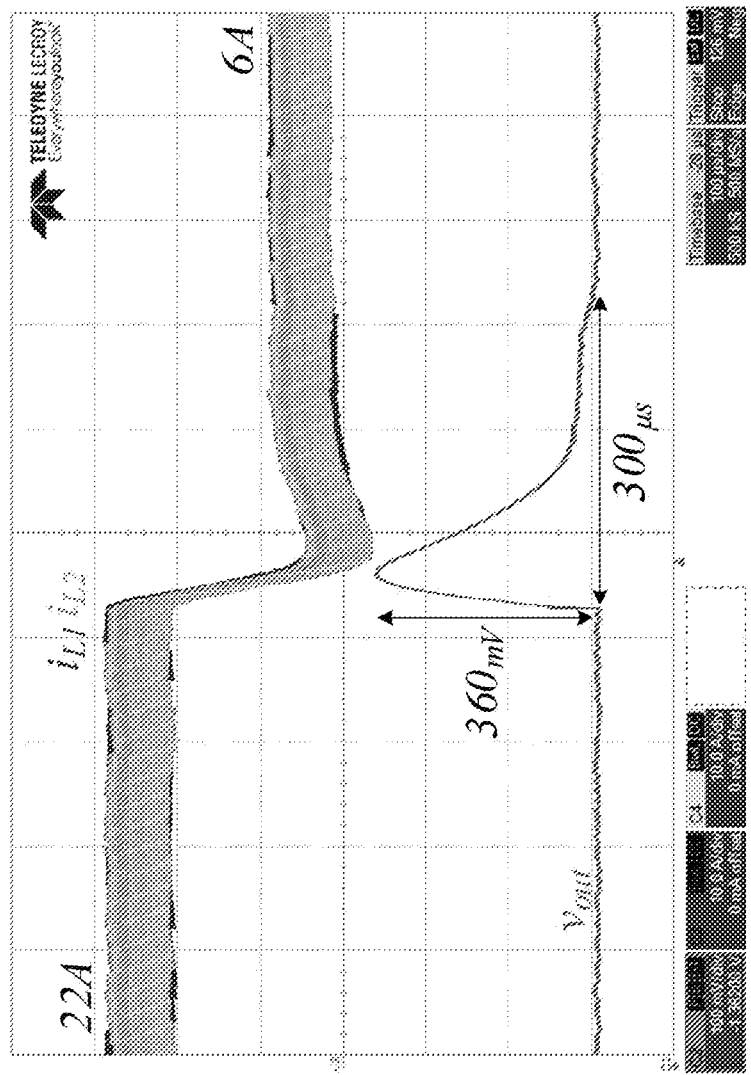
FIG. 19 shows small-signal compensator operation during an 88 A→24 A unloading transient event.
Figure 20:
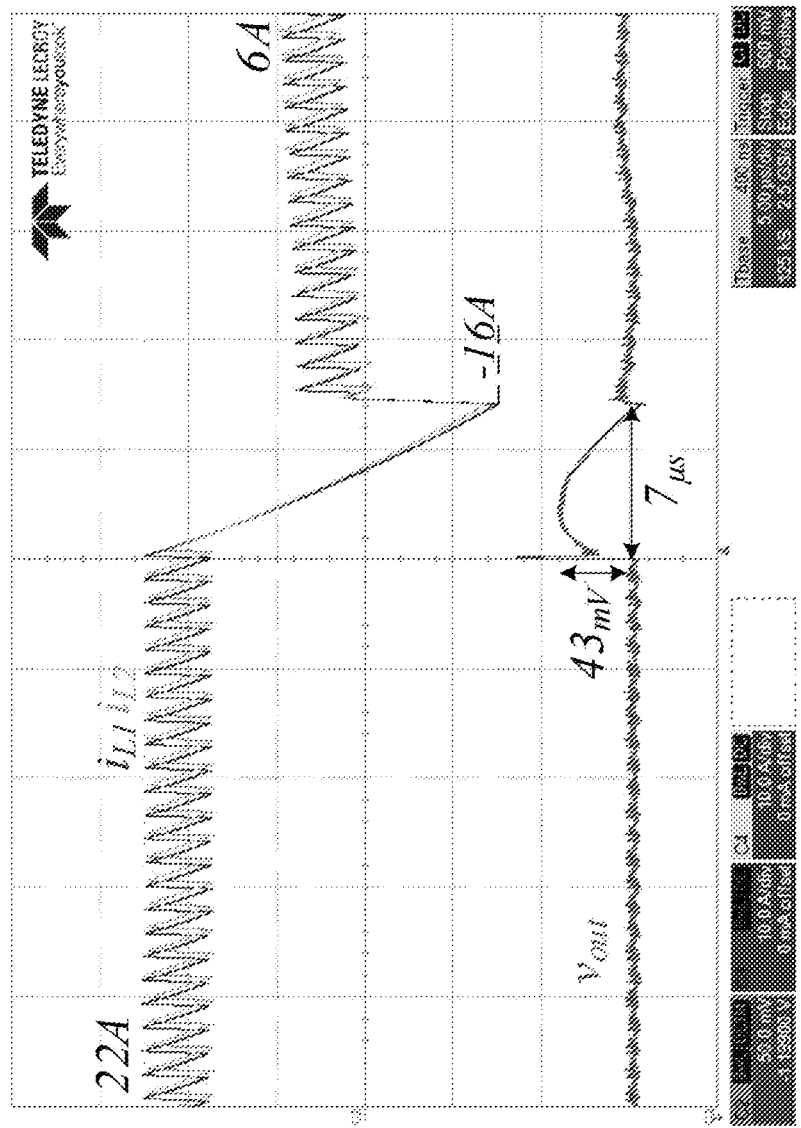
FIG. 20 shows large-signal compensator operation during an 88 A→24 A unloading transient event.

The unloading transient case is demonstrated with an 88 A to 24 A load step as shown in FIG. 19 (small-signal compensation) and FIG. 20 (TSU). While the overshoot obtained by the linear compensation scheme is measured at 360 mV and recovery within 300 μs, the transient-oriented recovery resulted in 43 mV with recovery time of 7 μs.

Figure 21:
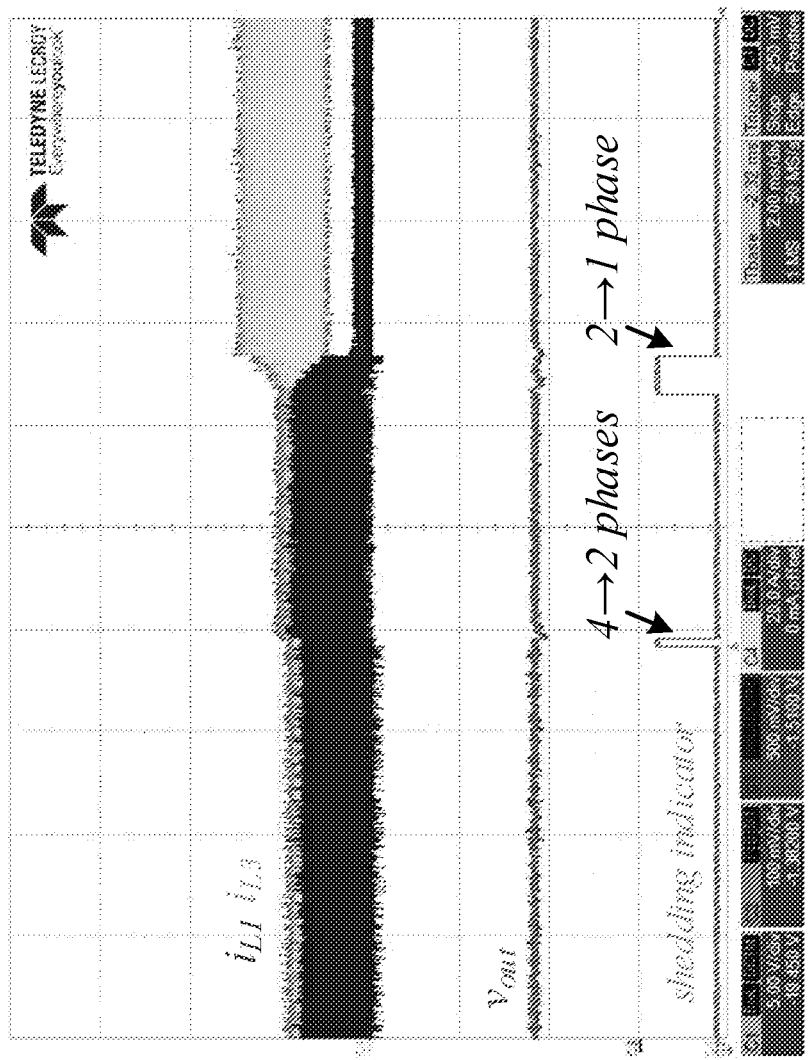
FIG. 21 shows phase shedding procedure at 20 A load steady-state operation, the controller transition from 4 phases to 2, and from 2 phases to a single phase.

FIG. 21 demonstrates the phase shedding capabilities of the controller during a steady-state operation. At a constant load of 20 A, the controller adjusts the active phase count from 4 to 1, thereby improving the VRM efficiency. The shedding process is divided into two steps as shown by the shedding indicator. At the first step, the controller shades phases 2 and 4, and at the second step, phase 3 is dropped, as well. The impact of the shedding processes on the output voltage is rather neglectable due to the governed shedding processes described above, such that the largest voltage deviation is measured to be less than 20 mV.

Figure 22:
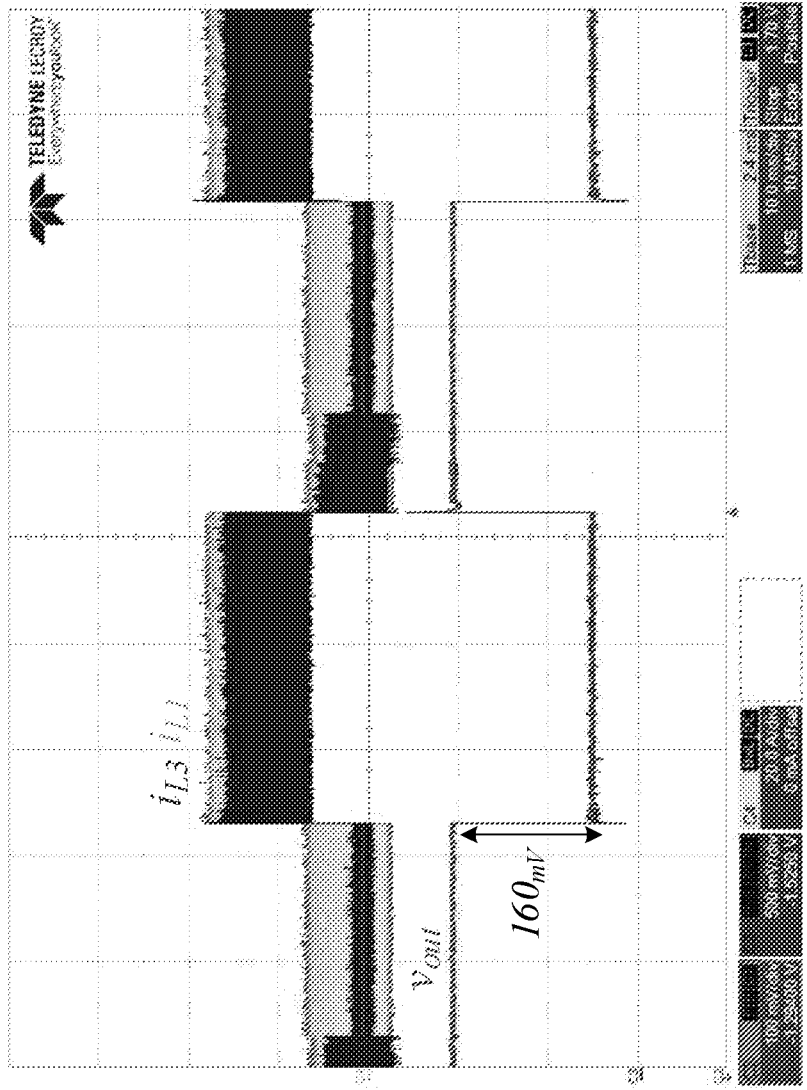
FIG. 22 shows complete hybrid controller operation including phase shedding and AVP functions at 5 A↔85 A load steps.

The complete operation of all the control introduced is demonstrated in FIG. 22, where the DDR emulation module is switched from 5 A to 85 A. During a loading transient event, the PCO transition form 1-to-4 phase operation and the AVP unit directs a 160 mV decrease in output voltage according to a 2 mΩ load line function. In the opposite case of unloading, the AVP unit increases the output voltage back to its original position. The steady-state phase shedding process takes place after the transient suppression is completed, where phases 2, 4 and 3 are shedded during the 5 A load operation.

Figure 23:
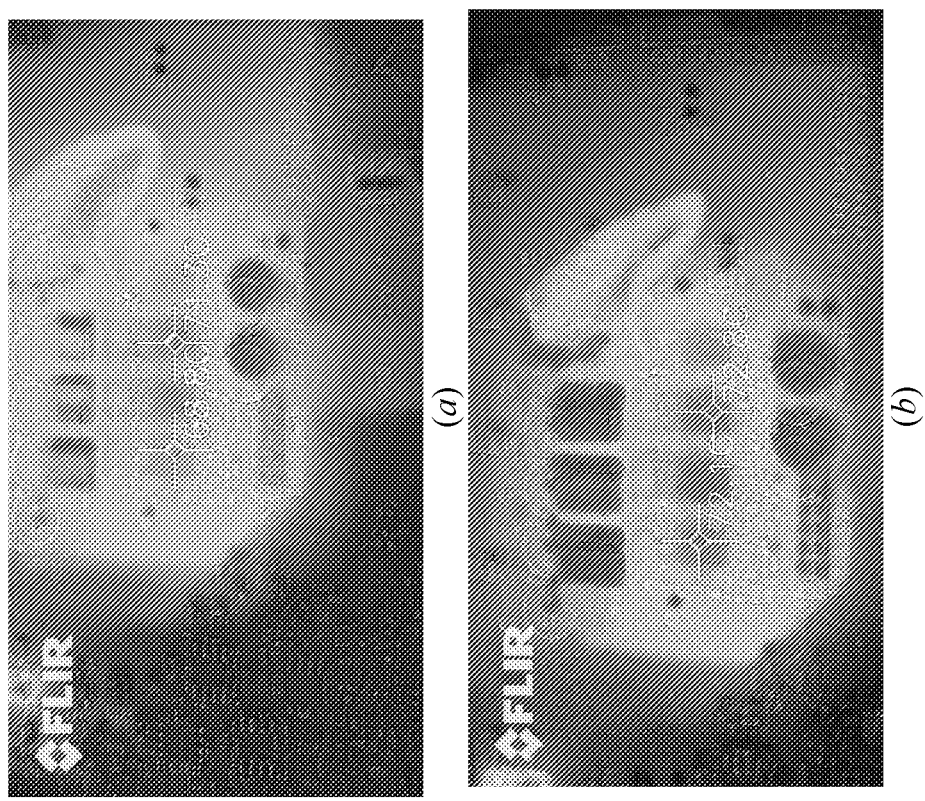
FIG. 23 shows multiphase VRM thermal imaging during a 90 A steady-state loading condition (a) voltage mode with unbalanced phase currents (b) ACM operation with inherent current sharing.

A thermal performance comparison between a voltage mode control scheme without active current balancing and ACM control inherent per-phase current balancing is depicted in FIG. 23. The difference in thermal distribution is tested at a 90 A steady-state operation, the voltage mode control (FIG. 23a) resulted a 2.5° C. difference between phases 2 and 4. The ACM control (FIG. 23b) improves the thermal sharing and results an 0.7° C. difference between phases 2 and 4.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A mixed-signal controller for controlling a multiphase average-current-mode voltage regulator having an output connected to a load, said controller comprises:
   a. a digital voltage-sampling Analog-to-Digital Converter (ADC), based on Delay-Lines (DLs) and configured to obtain a sample of an output voltage signal and to convert said output voltage signal from analog to digital representation;
   b. a digital current-sampling ADC, based on Delay-Lines (DLs) and configured to obtain a sample of a per-phase inductor current and to convert said inductor current from analog to digital representation;
   c. a digital compensator, for voltage regulation, receiving as input a digital voltage error signal ($v_e[n]$) created by a voltage loop and configured to generate a current reference signal, based on said digital voltage error signal;
   d. a digital compensator for current regulation, for receiving as input a current error signal $i_e[n]$ and for generating a duty-ratio command signal, based on said digital current error signal;
   e. a multiphase Digital Pulse Width Modulator (DPWM), based on DLs, for receiving as input the duty-ratio command signal for each phase, for generating a pulse-width-modulated signal (for each phase) that is fed to the gates of transistors of said ADC, to thereby control per-phase currents and output voltage supplied to said load;
   f. an analog front-end, for receiving differential measurements of the output voltage and the per-phase inductor current, where each signal is converted to a single-ended representation, such that single-ended signals are used for steady-state control via ADC measurement and a single-ended output voltage is used for transient detection and output voltage extremum detection during transient;
   g. a Transient Suppression Unit (TSU), for receiving as input a digital indication signal from the analog front-end and for generating gating signals being fed to the gates of transistors of a converter during a transient event, to thereby control the current and voltage supplied to said load during said transient event;
   h. a Phase Count Optimizer (PCO) unit for receiving as input a digital current reference signal and for generating, for each phase, an enable/disable control signal to a corresponding output tri-state buffer; and
   i. an Active Voltage Positioning (AVP) unit for receiving as input a digital current reference signal and for generating a voltage loop compensator voltage reference signal.

2. The controller according to claim 1, implemented using CMOS components.

3. The controller according to claim 1, in which the digital voltage-sampling ADC and the digital current-sampling ADCs are based on cell technology, with no modifications.

4. The controller according to claim 1, wherein a digital current reference compensator and per-phase digital duty-ratio compensators for each phase are first order compensators.

5. The controller according to claim 1, in which whenever the voltage loops are decoupled, each loop of each phase is regulated using a single state-variable.

6. The controller according to claim 1, comprising an outer voltage loop and a per-phase inner current loops with different bandwidths.

7. The controller according to claim 1, in which the multiphase DPWM comprises:
   a. a single Delay Line (DL) ring oscillator, for generating a clock signal for the per-phase PWM logic; and
   b. a duty-cycle logic block, for receiving as input a digital duty-cycle command and a DL ring outputs and for generating the pulse-width-modulated signal that controls the gates of the transistors,
   wherein the pulse-width-modulated signals for said gates are synchronized for interleaved operation, or out of synchronization for non-interleaved operation.

8. The controller according to claim 1, wherein the TSU comprises:
   a. a state-machine based logic block, for generating gating signals to be fed into the gates of transistors of phases of said ADC during transient event;
   b. a fault protection logic, for fast TSU operation termination and return to DPWM operation; and
   c. a handoff estimation block, for receiving a pre-transient current reference signal and duty-ratio commands and for generating an estimated post transient values for the current reference signal and duty-ratio commands.

9. The controller according to claim 1, wherein the PCO comprises:
   a. a Low Pass Filter (LPF), for receiving the current reference signal and generating a moving-average representation of the current reference signal, based on said current reference signal; and
   b. a state-machine based logic block, for receiving said average current reference signal and transient indication signals, and for generating controlled enable/disable signals for each of the individual phases.

10. The controller according to claim 1, wherein the AVP comprises:
   a. a reference calculation block, for receiving an average current reference signal generated by the PCO and generating a digital reference voltage signal for the voltage compensator; and
   b. a transient correction block, for receiving the current step estimation from the TSU and generating a correction signal to said calculation blocks, following a transient event.

11. The controller according to claim 1, wherein an active number of phases is optimized by the PCO by the steps of:
   a. on power up, turning on all phases;
   b. monitoring an average current reference signal at a voltage compensator output, to determine an optimal phase count;
   c. taking over the current reference signal of a specific phase to be shutdown/turn-on and issuing the relevant enable signal to output buffers;
   d. return to monitoring said average current reference signal at said voltage compensator output to determine said optimal phase count; and
   e. during a transient event, setting all phases to be in an active mode, and returning to monitoring an average current reference signal at a voltage compensator output, to determine an optimal phase count.

12. A method for voltage regulation in mixed-signal hybrid Average Current-Mode (ACM) controller architecture, comprising:
   a. during steady-state operation of said ACM controller, simultaneously measuring an output voltage and average per-phase inductor current, once for each active phase during a switching cycle and in synchronization with an interleaved operation of a multiphase Digital Pulse Width Modulator (DPWM) that controls per-phase currents and output voltage supplied to the load;

b. using the output voltage measurement for generating a voltage error ($v_e[n]$);

c. using a voltage compensator for calculating a current reference signal;

d. generating, by using calculated current reference signal and the inductor current measurement, a current error signal ($i_e[n]$) which is used by a per-phase current compensator to generate a specific phase duty-cycle command (d[n]);

e. receiving said duty-cycle command d[n] by a multiphase DPWM and generating steady-state gating signals;

f. if a transient event occurs during steady-state operation, sensing a transient start time and a transient direction (loading or unloading) by a transient detection sensor;

g. upon detecting a transient event, using a Phase Count Optimizer (PCO) for activating all available phases and allowing a Transient Suppression Unit (TSU) to take control over the transient gating signals and to begin counting ($T_0$);

h. according to the transient direction, said TSU turns on all the phases, using low-side transistors for unloading transients, and high-side transistors for loading transients;

i. continuing step g. above until an output voltage extremum is measured by an extremum detection sensor, while said TSU stops the $T_0$ counter and if no output voltage extremum is detected, resuming the steady-state operation;

j. generating the remaining gating signals timings by said TSU, based on the counter value of $T_0$ and an average duty-cycle value (D), where the correction signals of a hand-off procedure are calculated based on To and fed back to a steady-state controller;

k. completing a gating sequence by said TSU according to the values generated in step i. above; and l. upon completing a full TSU gating sequence, transferring the control over the gating signals back to said ACM controller, while resuming phase synchronization by said DPWM and steady-state operation according to step a. above.

13. The method according to claim 12, wherein the multiphase DPWM comprises:

a. a single Delay-Line (DL) ring oscillator, for generating a clock signal for a per-phase PWM logic; and b. a duty-cycle logic block, for receiving as input a digital duty-cycle command and DL ring outputs and for generating the pulse-width-modulated signal that controls gates of transistors, wherein control signals for said gates are synchronized for interleaved operation or out of synchronization for non-interleaved operation.

14. The method according to claim 12, wherein the TSU comprises:

a. a state-machine based logic block, for generating gating signals to be fed into the gates of transistors of an ADC during transient event;

b. a fault protection logic, for fast TSU operation termination and return to DPWM operation; and c. a handoff estimation block, for receiving a pre-transient current reference signal and duty-ratio commands and for generating estimated post transient values for the current reference signal and duty-ratio commands.

15. The method according to claim 12, wherein the Phase Count Optimizer (PCO) comprises:

a. a Low Pass Filter (LPF), for receiving the current reference signal and generating a moving-average representation of the current reference signal, based on said current reference signal; and b. a state-machine based logic block, for receiving said moving-average representation of the current reference signal and transient indication signals, and for generating controlled enable/disable signals for each of the individual phases.

16. The method according to claim 12, wherein an active number of phases is optimized by the Phase Count Optimizer (PCO) by the steps of:

a. on power up, turning on all phases;

b. monitoring an average current reference signal at a voltage compensator output, to determine an optimal phase count;

c. taking over the current reference signal of a specific phase to be shutdown/turn-on and issuing a relevant enable signal to output buffers;

d. return to monitoring the average current reference signal at the voltage compensator output to determine said optimal phase count; and e. during a transient event, setting all phases to be in an active mode, and returning to monitoring an average current reference signal at a voltage compensator output, to determine an optimal phase count.

* * * * *